(12) United States Patent
Osawa

(10) Patent No.: US 12,613,292 B2
(45) Date of Patent: Apr. 28, 2026

(54) POWER SUPPLY DEVICE, AND CONTROL METHOD FOR POWER SUPPLY DEVICE

(71) Applicant: MINEBEA MITSUMI Inc., Nagano (JP)

(72) Inventor: Susumu Osawa, Nagano (JP)

(73) Assignee: MINEBEA MITSUMI Inc., Nagano (JP)

( * ) Notice: Subject to any disclaimer, the term of this patent is extended or adjusted under 35 U.S.C. 154(b) by 122 days.

(21) Appl. No.: 18/696,004

(22) PCT Filed: Sep. 29, 2022

(86) PCT No.: PCT/JP2022/036495
§ 371 (c)(1),
(2) Date: Mar. 27, 2024

(87) PCT Pub. No.: WO2023/054607
PCT Pub. Date: Apr. 6, 2023

(65) Prior Publication Data
US 2024/0393410 A1 Nov. 28, 2024

(30) Foreign Application Priority Data
Sep. 30, 2021 (JP) ................................. 2021-162343

(51) Int. Cl.
*G01R 31/64* (2020.01)
*G01R 27/26* (2006.01)
*H02J 7/00* (2026.01)

(52) U.S. Cl.
CPC ......... *G01R 31/64* (2020.01); *G01R 27/2605* (2013.01); *H02J 7/0048* (2020.01)

(58) Field of Classification Search
CPC ........ G01R 27/00; G01R 27/02; G01R 27/26; G01R 31/00; G01R 31/005; G01R 31/006;

(Continued)

(56) References Cited

U.S. PATENT DOCUMENTS

2010/0228416 A1 9/2010 Sugiyama
2015/0329009 A1 11/2015 Dente
2025/0047127 A1* 2/2025 Osawa .................. H01M 10/48

FOREIGN PATENT DOCUMENTS

CN 203747452 U * 7/2014 ................ H02J 7/00
CN 203747485 U * 7/2014 ................ H02J 7/02

(Continued)

OTHER PUBLICATIONS

Written Opinion of the International Searching Authority for PCT/ JP2022/036495 mailed on Nov. 29, 2022.

(Continued)

*Primary Examiner* — Hoai-An D. Nguyen
(74) *Attorney, Agent, or Firm* — IPUSA, PLLC

(57) ABSTRACT

A power supply device of the present invention includes a storage circuit including electrical double layer capacitor between first node connected to a power supply, which is an in-vehicle battery, and second node grounded; a charge circuit connected to the first node and configured to charge the storage circuit; and a power supply controller configured to measure voltage at the first node and control the charge circuit. The power supply controller performs procedure of causing the charge circuit to charge the storage circuit and computing first capacitance value and first equivalent series resistance value of the electrical double layer capacitor based on voltage measured at the first node, upon determining the voltage at the first node is lower than a threshold voltage value, that is, determining a stop period of a vehicle is longer than a threshold period.

5 Claims, 23 Drawing Sheets

(58) Field of Classification Search
CPC .... G01R 31/50; G01R 27/2605; G01R 31/64;
H02J 7/00; H02J 7/0047; H02J 7/0048;
H02J 7/14; H02J 7/1446; G01D 5/00;
G01D 5/12; G01D 5/14; G01D 5/24
USPC ........................................ 324/500, 537, 548
See application file for complete search history.

(56) References Cited

FOREIGN PATENT DOCUMENTS

| | | | | |
|---|---|---|---|---|
| CN | 213937449 U | * | 8/2021 | ............... H02J 3/32 |
| JP | 2011-130653 | | 6/2011 | |
| JP | 2013-176197 | | 9/2013 | |
| JP | 2014-230389 | | 12/2014 | |
| JP | 6675874 | | 4/2020 | |
| WO | 2022/210441 | | 10/2022 | |

OTHER PUBLICATIONS

International Search Report for PCT/JP2022/036495 mailed on Nov. 29, 2022.

* cited by examiner

Figure 4:
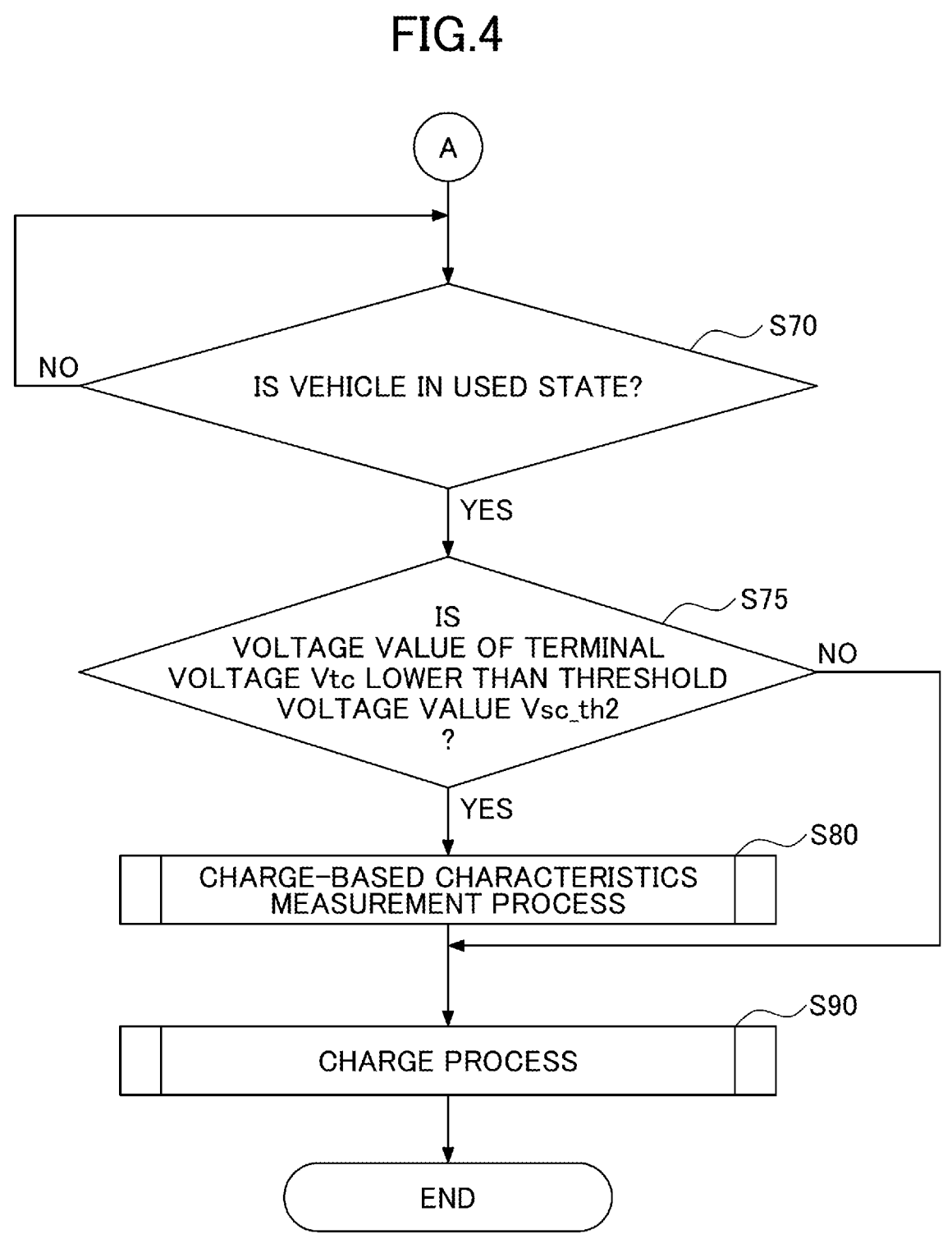

IS VEHICLE IN USED STATE?

NO

YES

S75

IS
VOLTAGE VALUE OF TERMINAL
VOLTAGE Vtc LOWER THAN THRESHOLD
VOLTAGE VALUE Vsc_th2
?

NO

YES

S80

CHARGE-BASED CHARACTERISTICS
MEASUREMENT PROCESS

S90

CHARGE PROCESS

END

START OF DISCHARGE-BASED
CHARACTERISTICS MEASUREMENT PROCESS

CAPACITANCE VALUE
MEASUREMENT PROCESS                    S22

ESR VALUE MEASUREMENT PROCESS          S24

END OF DISCHARGE-BASED
CHARACTERISTICS MEASUREMENT PROCESS $Vtc=Vtc1$      SWd      I_R

10

ESRsc

Vc

Csc

R_discharge
$R=R1+R2$

FIG.7

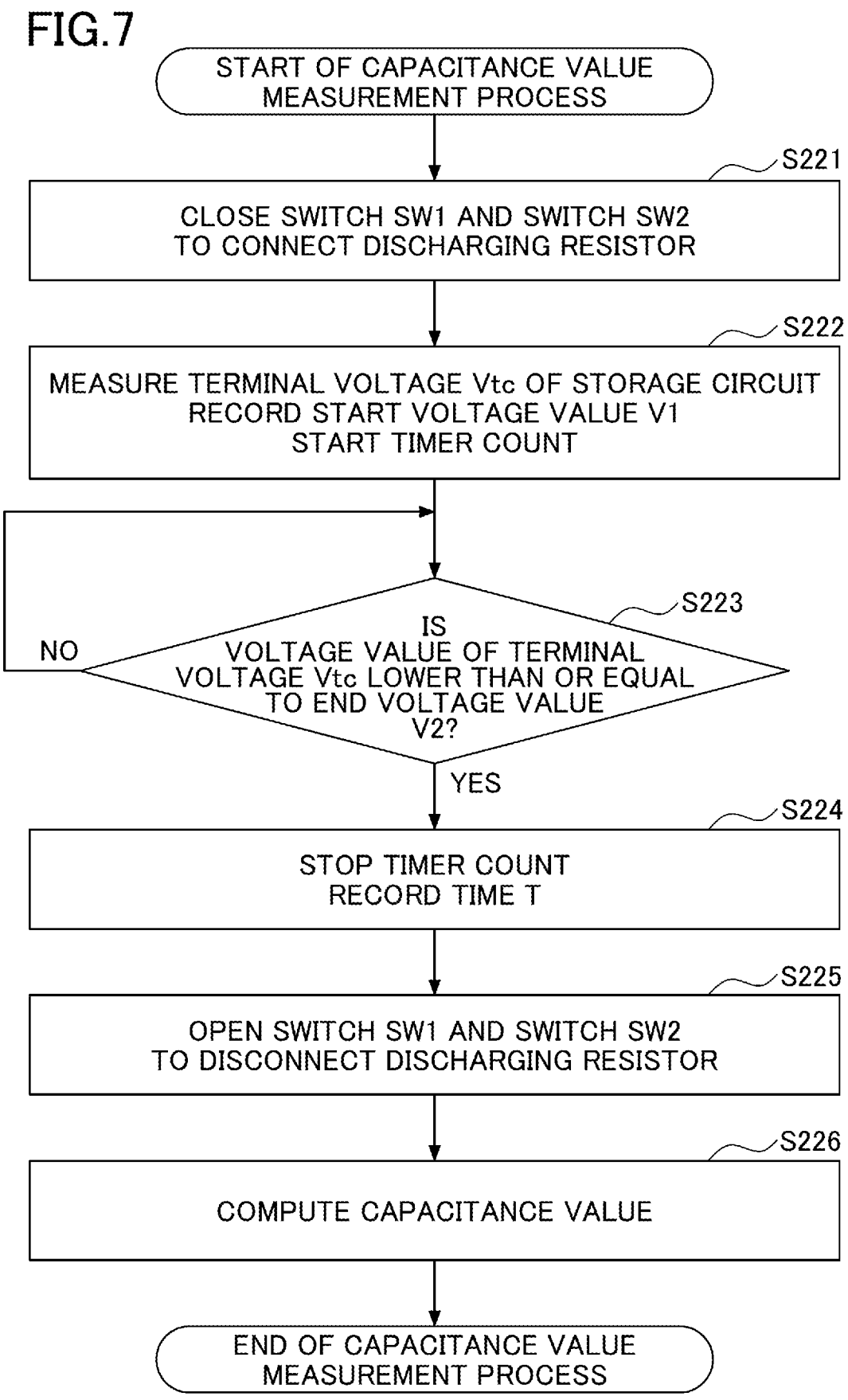

START OF CAPACITANCE VALUE
MEASUREMENT PROCESS

S221

CLOSE SWITCH SW1 AND SWITCH SW2
TO CONNECT DISCHARGING RESISTOR

S222

MEASURE TERMINAL VOLTAGE Vtc OF STORAGE CIRCUIT
RECORD START VOLTAGE VALUE V1
START TIMER COUNT

S223

IS
VOLTAGE VALUE OF TERMINAL
VOLTAGE Vtc LOWER THAN OR EQUAL
TO END VOLTAGE VALUE
V2?

NO

YES

S224

STOP TIMER COUNT
RECORD TIME T

S225

OPEN SWITCH SW1 AND SWITCH SW2
TO DISCONNECT DISCHARGING RESISTOR

S226

COMPUTE CAPACITANCE VALUE

END OF CAPACITANCE VALUE
MEASUREMENT PROCESS

FIG.8

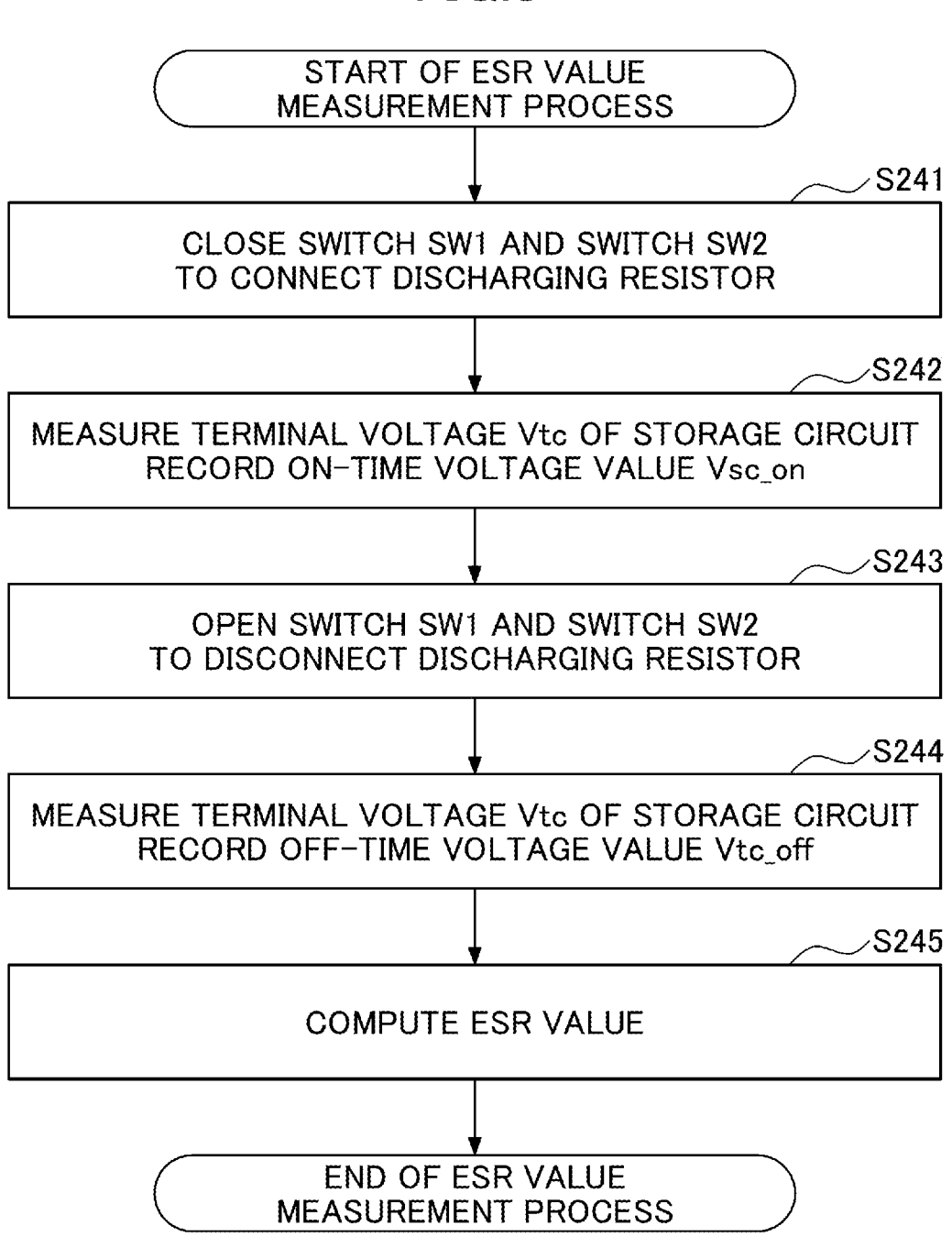

START OF ESR VALUE
MEASUREMENT PROCESS

S241

CLOSE SWITCH SW1 AND SWITCH SW2
TO CONNECT DISCHARGING RESISTOR

S242

MEASURE TERMINAL VOLTAGE Vtc OF STORAGE CIRCUIT
RECORD ON-TIME VOLTAGE VALUE Vsc_on

S243

OPEN SWITCH SW1 AND SWITCH SW2
TO DISCONNECT DISCHARGING RESISTOR

S244

MEASURE TERMINAL VOLTAGE Vtc OF STORAGE CIRCUIT
RECORD OFF-TIME VOLTAGE VALUE Vtc_off

S245

COMPUTE ESR VALUE

END OF ESR VALUE
MEASUREMENT PROCESS

FIG.9

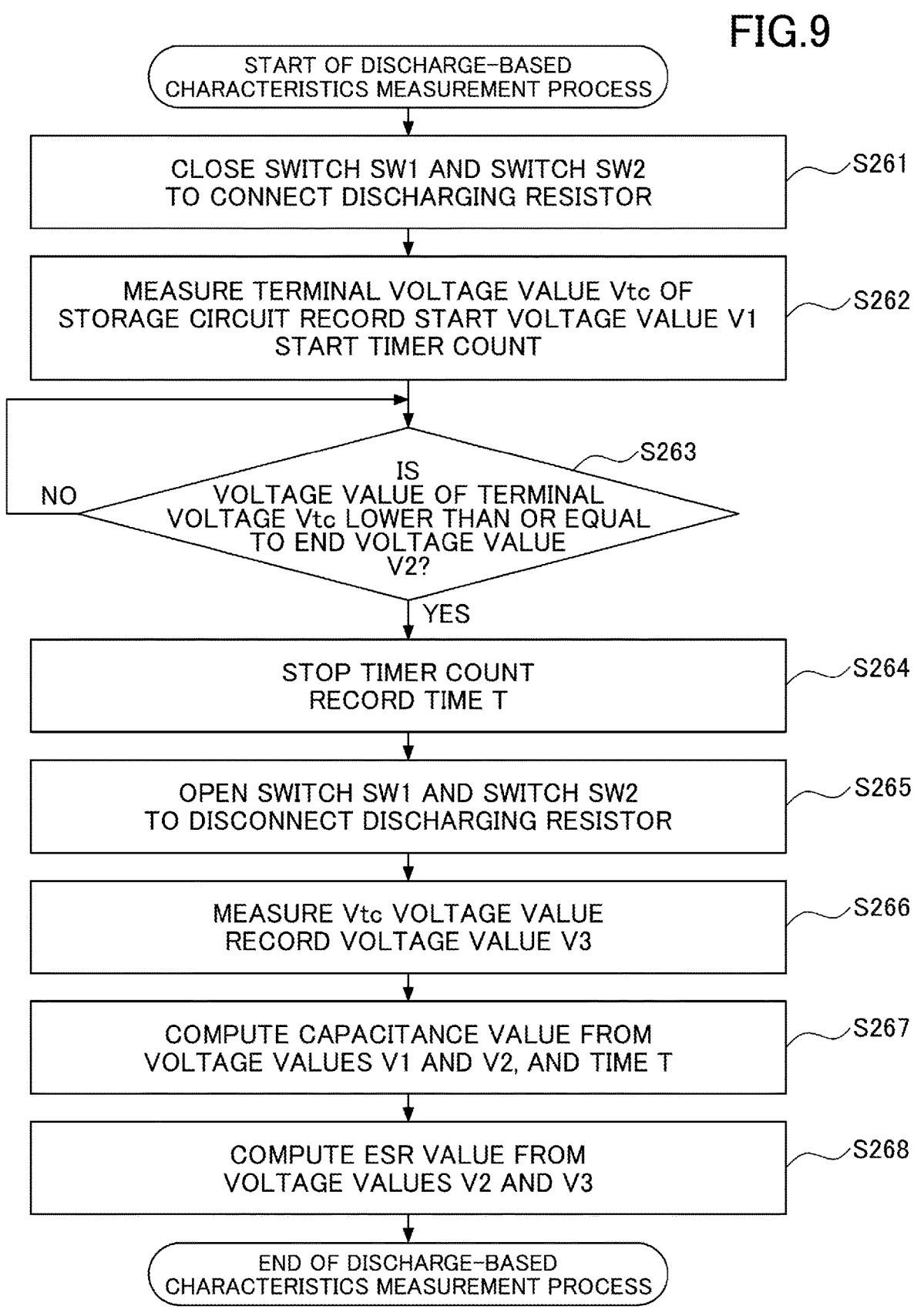

START OF DISCHARGE-BASED
CHARACTERISTICS MEASUREMENT PROCESS

CLOSE SWITCH SW1 AND SWITCH SW2
TO CONNECT DISCHARGING RESISTOR ⟋S261

MEASURE TERMINAL VOLTAGE VALUE Vtc OF
STORAGE CIRCUIT RECORD START VOLTAGE VALUE V1
START TIMER COUNT ⟋S262

IS
VOLTAGE VALUE OF TERMINAL
VOLTAGE Vtc LOWER THAN OR EQUAL
TO END VOLTAGE VALUE
V2? ⟋S263

NO

YES

STOP TIMER COUNT
RECORD TIME T ⟋S264

OPEN SWITCH SW1 AND SWITCH SW2
TO DISCONNECT DISCHARGING RESISTOR ⟋S265

MEASURE Vtc VOLTAGE VALUE
RECORD VOLTAGE VALUE V3 ⟋S266

COMPUTE CAPACITANCE VALUE FROM
VOLTAGE VALUES V1 AND V2, AND TIME T ⟋S267

COMPUTE ESR VALUE FROM
VOLTAGE VALUES V2 AND V3 ⟋S268

END OF DISCHARGE-BASED
CHARACTERISTICS MEASUREMENT PROCESS

START OF CHARGE-BASED
CHARACTERISTICS MEASUREMENT PROCESS

S82
CAPACITANCE VALUE
MEASUREMENT PROCESS

S84
ESR VALUE MEASUREMENT PROCESS

END OF CHARGE-BASED
CHARACTERISTICS MEASUREMENT PROCESS

START OF CHARGE-BASED
CHARACTERISTICS MEASUREMENT PROCESS

S182

CAPACITANCE VALUE
MEASUREMENT PROCESS

S184

ESR VALUE MEASUREMENT PROCESS

END OF CHARGE-BASED
CHARACTERISTICS MEASUREMENT PROCESS

FIG.26

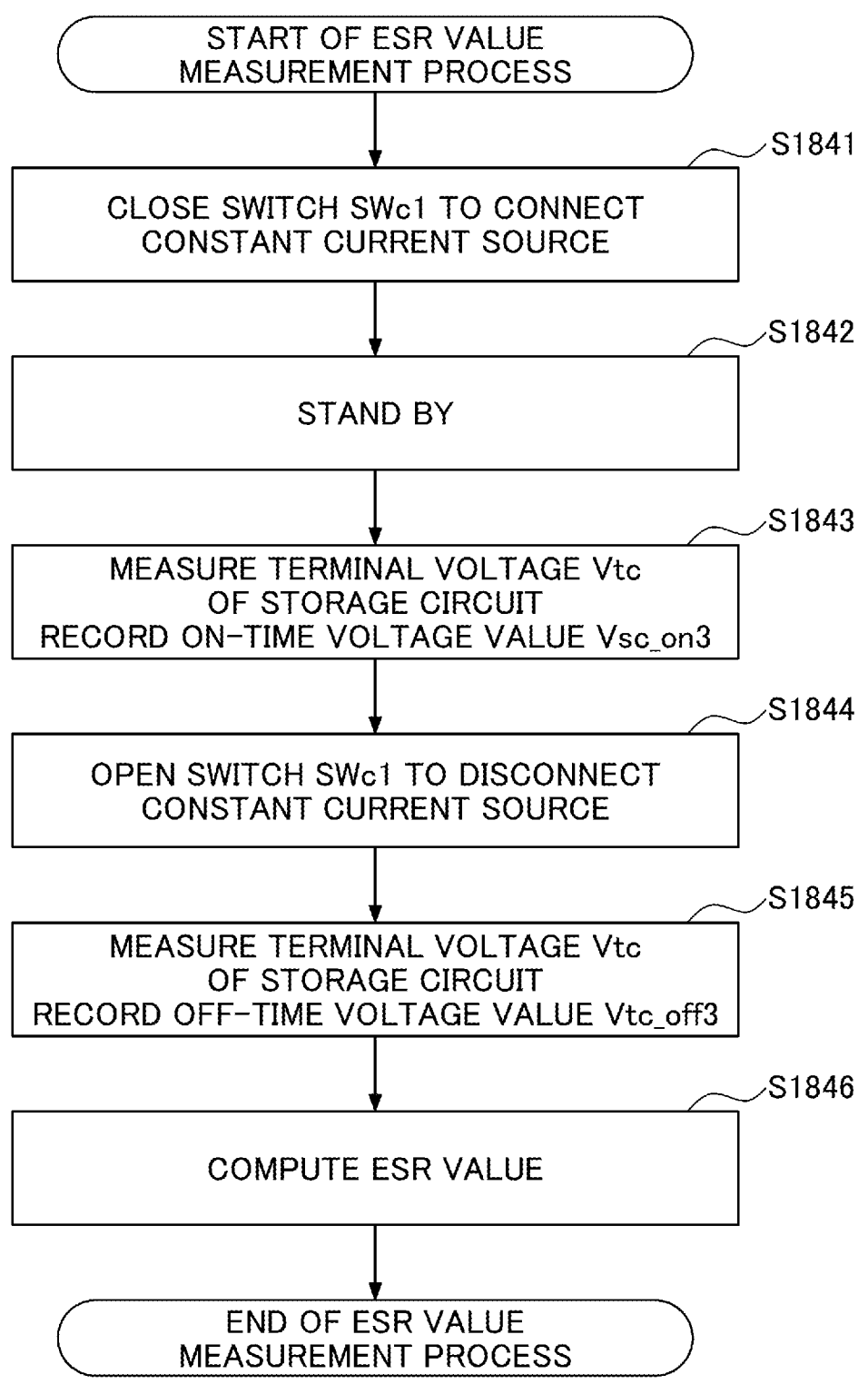

START OF ESR VALUE
MEASUREMENT PROCESS

S1841
CLOSE SWITCH SWc1 TO CONNECT
CONSTANT CURRENT SOURCE

S1842
STAND BY

S1843
MEASURE TERMINAL VOLTAGE Vtc
OF STORAGE CIRCUIT
RECORD ON-TIME VOLTAGE VALUE Vsc_on3

S1844
OPEN SWITCH SWc1 TO DISCONNECT
CONSTANT CURRENT SOURCE

S1845
MEASURE TERMINAL VOLTAGE Vtc
OF STORAGE CIRCUIT
RECORD OFF-TIME VOLTAGE VALUE Vtc_off3

S1846
COMPUTE ESR VALUE

END OF ESR VALUE
MEASUREMENT PROCESS

1

POWER SUPPLY DEVICE, AND CONTROL METHOD FOR POWER SUPPLY DEVICE

TECHNICAL FIELD

The present disclosure relates to power supply devices, and control methods for power supply devices.

BACKGROUND ART

In a vehicle, a known backup power supply is provided to supply electric energy in place of a main power supply or to supplement the main power supply, in a case where a failure or interruption of the main power supply occurs (see, for example, Patent Document 1).

PRIOR ART DOCUMENTS

Patent Documents

Patent Document 1: Japanese Patent No. 6675874

DISCLOSURE OF THE INVENTION

Problem to be Solved by the Invention

Patent Document 1 discloses using a super capacitor as the backup power supply. Patent Document 1 discloses including a diagnostic module configured to monitor a state-of-health of a supercapacitor by measuring capacitance value and internal equivalent resistance.

A capacitance value and an equivalent series resistance value of an electrical double layer capacitor measured upon discharge may be ineffective as characteristics of the electrical double layer capacitor after a long time has passed from the discharge. Meanwhile, when characteristics of an electrical double layer capacitor are measured every time upon start of use, it takes time to start-up a power supply device.

The present disclosure provides a power supply device in which characteristics of an electrical double layer capacitor that are effective upon start of use, can be obtained.

Means of Solving the Problem

According to one aspect of the present disclosure, there is provided a power supply device including: a storage circuit including a first node connected to a power supply, a second node that is grounded, and an electrical double layer capacitor between the first node and the second node; a charge circuit connected to the first node and configured to charge the storage circuit; and a power supply controller configured to measure a voltage at the first node and control the charge circuit. The power supply controller performs a procedure of causing the charge circuit to charge the storage circuit and computing a first capacitance value and a first equivalent series resistance value based on the voltage measured at the first node, in response to determining that a stop period is longer than a threshold period.

Effects of the Invention

According to the power supply device of the present disclosure, it is possible to obtain characteristics of an electrical double layer capacitor that are effective upon start of use.

2

BRIEF DESCRIPTION OF THE DRAWINGS

FIG. 4 is a flowchart illustrating the processing procedure of the power supply device according to the first embodiment.

FIG. 7 is a flowchart of a capacitance value measurement process of the storage circuit in the power supply device according to the first embodiment.

FIG. 8 is a flowchart of an equivalent series resistance value measurement process of the storage circuit in the power supply device according to the first embodiment.

FIG. 9 is a flowchart of a capacitance value and equivalent series resistance value measurement process (characteristics measurement process) of the storage circuit in the power supply device according to the first embodiment.

FIG. 26 is a flowchart of the equivalent series resistance value measurement process of the storage circuit in the power supply device according to the second embodiment.

MODE OF CARRYING OUT THE INVENTION

Hereinafter, the power supply device according to the present embodiment will be described in detail with reference to the drawings.

First Embodiment

<Power Supply Device 1>

Figure 1:
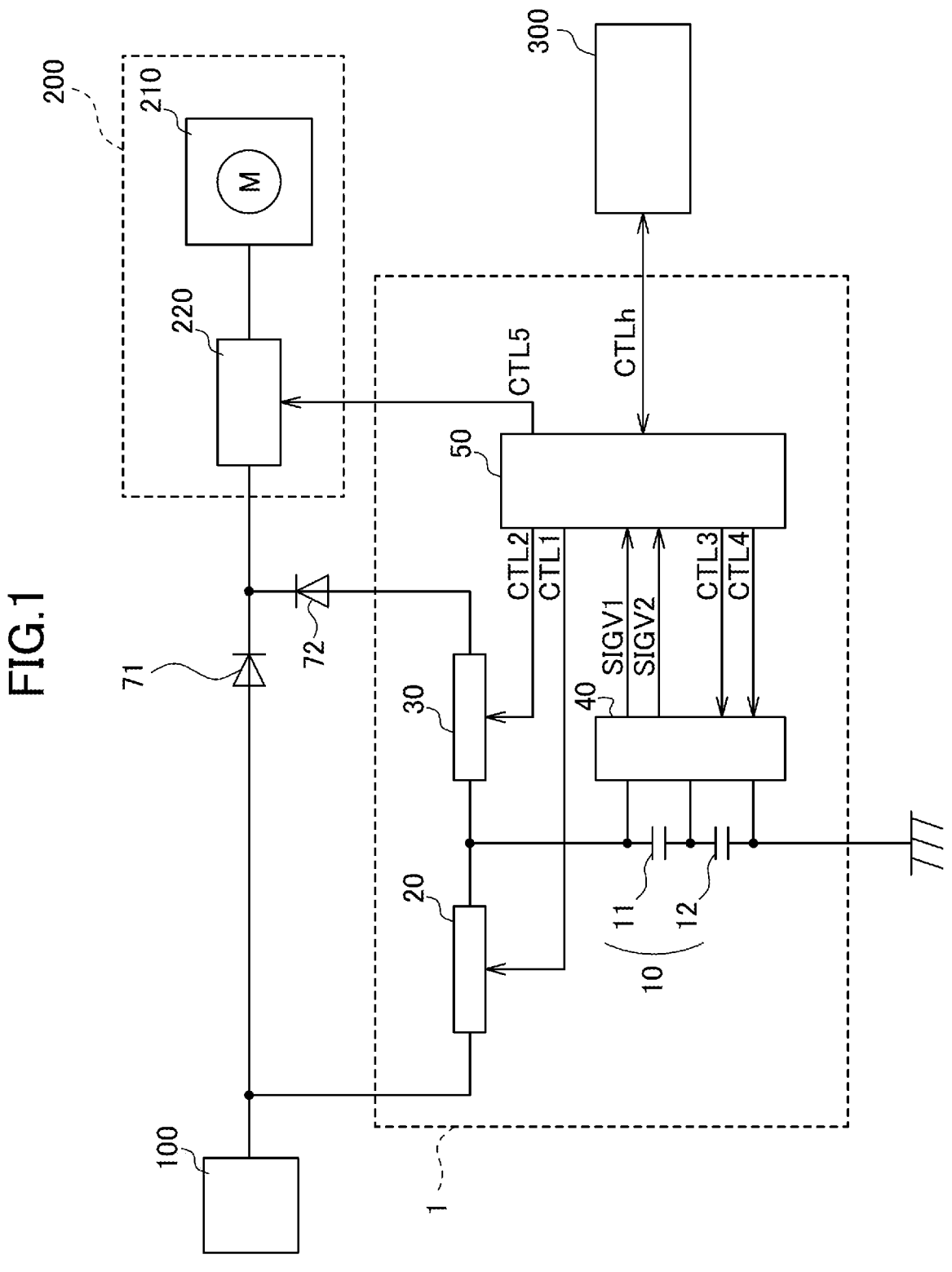
FIG. 1 is a diagram illustrating a configuration example of a power supply device according to a first embodiment.

FIG. 1 is a diagram illustrating a configuration example of a power supply device 1 according to the present embodiment. In recent years, in a latch mechanism that is a mechanical lock mechanism of an automobile door, a system that operates a lock portion of a latch by a motor is adopted as an electric latch system. The automobile door is required to unlock even in case of an emergency, such as an accident or the like. For this reason, even in a case where a battery power supply fails due to breakage or the like caused by the accident, the electric latch system is required to continue operating for a certain period of time. The power supply device 1 according to the present embodiment is used, for example, as a backup power supply for the electric latch system.

The power supply device 1 stores electric power supplied from a power supply 100. In addition, the power supply device 1 supplies electric power to a load device 200 when the electric power from the power supply 100 is cut off. The power supply 100 is also directly connected to the load device 200. The power supply 100 is connected to the load device 200 via a diode 71, in order to prevent a reverse current.

The power supply 100 is an in-vehicle battery, for example. The load device 200 includes a load 210, and a load driving circuit 220 configured to drive the load 210. The load 210 is a motor in an electric latch system of a motor vehicle door, for example.

The power supply device 1 includes a storage circuit 10, a charge circuit 20, a boosting circuit 30, an equalization and discharge circuit 40, and a power supply controller 50. Each of these constituent elements of the power supply device 1 will be described.

[Storage Circuit 10]

The storage circuit 10 is a circuit configured to store electric power. The storage circuit 10 includes at least one electrical double layer capacitor, that is, a so-called super capacitor. The storage circuit 10 of the power supply device 1 according to the present embodiment includes an electrical double layer capacitor 11 and an electrical double layer capacitor 12 that are connected in series.

[Charge Circuit 20]

The charge circuit 20 is configured to charge the storage circuit 10 with the electric power supplied from the power supply 100. The charge circuit 20 performs a charge process based on a charge control signal CTL1 of the power supply controller 50.

[Boosting Circuit 30]

The boosting circuit 30 is configured to boost the electric power supplied from the storage circuit 10, and supply the boosted electric power to the load device 200. The boosting circuit 30 supplies the electric power based on a boosting control signal CTL2 of the power supply controller 50. The boosting circuit 30 is connected to the load device 200 via a diode 72, in order to prevent a reverse current. The diode 72 may be omitted.

[Equalization and Discharge Circuit 40]

Figure 2:
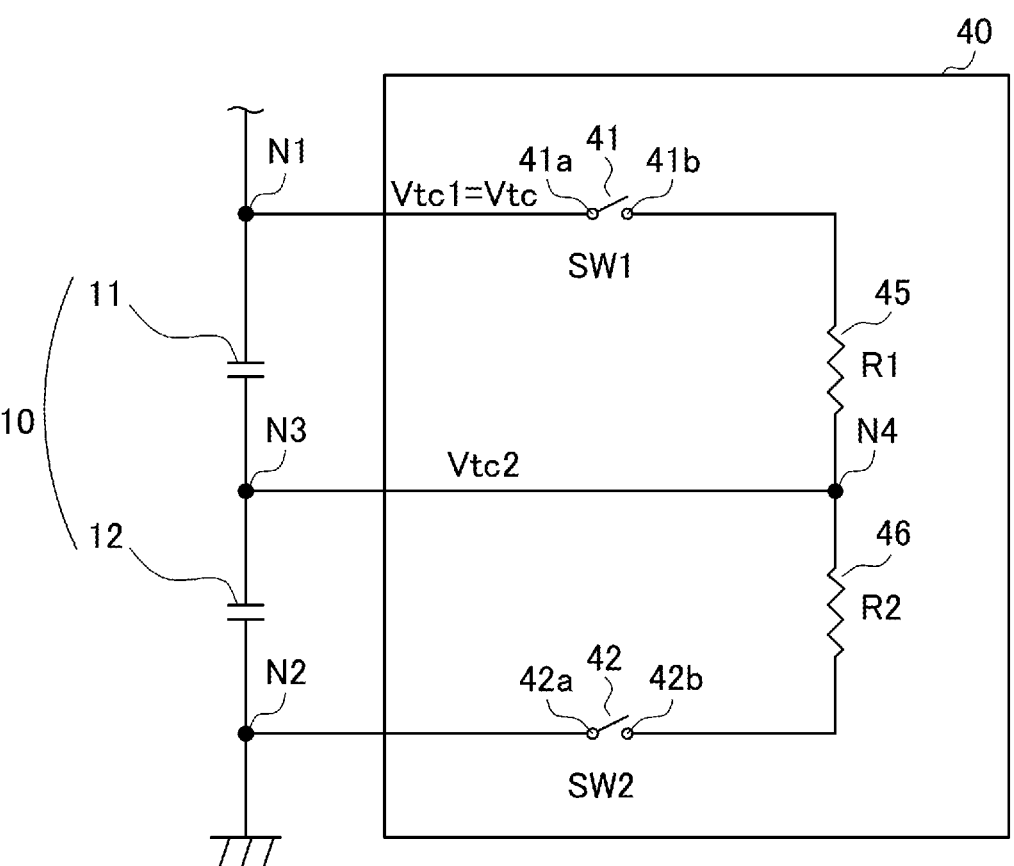
FIG. 2 is a diagram illustrating a configuration example of an equalization and discharge circuit of the power supply device according to the first embodiment.

The equalization and discharge circuit 40 is configured to perform an equalization process to the storage circuit 10. In addition, the equalization and discharge circuit 40 performs a discharge process on the storage circuit 10. FIG. 2 is a diagram illustrating a configuration example of the equalization and discharge circuit 40 of the power supply device 1 according to the present embodiment.

In a case where the electrical double layer capacitors, such as the super capacitors or the like, are connected in series, an imbalance may occur in voltage sharing of the capacitors due to variations in individual leakage currents, variations in individual capacitances, or the like. When the imbalance occurs in the voltage sharing of the capacitors, there is a possibility that a voltage exceeding a rated value or a set value will be applied to one of the capacitors, even if a voltage of the series-connected capacitors as a whole, obtained by adding the rated voltages of the individual capacitors, falls within a rated voltage. In order to prevent the voltage exceeding the rated value or the set value from being applied to the electrical double layer capacitor 11 or the electrical double layer capacitor 12, the equalization and discharge circuit 40 performs the equalization process to eliminate a voltage sharing imbalance and equalize voltages applied to the respective capacitors.

The equalization and discharge circuit 40 performs the equalization process and the discharge process of the storage circuit 10 by a SW1 control signal CTL3 for opening and closing a switch 41 and a SW2 control signal CTL4 for opening and closing a switch 42. In addition, the equalization and discharge circuit 40 outputs a voltage signal SIGV1 of an electrical double layer capacitor 11 and a voltage signal SIGV2 of an electrical double layer capacitor 12, to the power supply controller 50.

The equalization and discharge circuit 40 includes the switches 41 and 42, and resistors 45 and 46. The storage circuit 10 includes the electrical double layer capacitor 11 between a node N1 and a node N3. The storage circuit 10 includes the electrical double layer capacitor 12 between the node N3 and a node N2. The node N1 is connected to the power supply 100 and the load device 200. The node N2 is grounded.

The switch 41 includes a first terminal 41a and a second terminal 41b. The switch 41 makes a connection or disconnection between the first terminal 41a and the second terminal 41b. The switch 41 is provided between the node N1 and a resistor 45. In the following description, the switch

41 may also be referred to as a switch SW1. The switch 41 is opened and closed based on the SW1 control signal CTL3.

The resistor 45 is provided between the switch 41 and a node N4. The resistor 45 and a resistor 46 are connected in series at the node N4. The resistor 45 has a resistance value R1.

The switch 42 includes a first terminal 42a and a second terminal 42b. The switch 42 makes a connection or disconnection between the first terminal 42a and the second terminal 42b. The switch 42 is provided between the node N2 and the resistor 46. In the following description, the switch 42 may also be referred to as a switch SW2. The switch 42 is opened and closed based on the SW2 control signal CTL4.

The resistor 46 is provided between the node N4 and the node N2. The resistor 46 has a resistance value R2. The resistance value R2 may be equal to the resistance value R1. A case where the resistance values are equal to each other is not limited to the case where the resistance values perfectly match each other, and includes the case where the resistance values are the same within a range including a manufacturing error, for example.

The equalization and discharge circuit 40 outputs a terminal voltage Vtc1 at the node N1 to the power supply controller 50, as the voltage signal SIGV1. Moreover, the equalization and discharge circuit 40 outputs a terminal voltage Vtc2 at the node N3 to the power supply controller 50, as the voltage signal SIGV2. The voltage at the node N1 may also be referred to as a terminal voltage Vtc of the storage circuit 10.

The node N1 is an example of the first node, and the node N2 is an example of the second node.

[Power Supply Controller 50]

The power supply controller 50 is configured to control charge, power supply, discharge, and equalization of the storage circuit 10. Also, the power supply controller 50 measures the characteristics of the storage circuit 10. The power supply controller 50 is formed by, for example, a controller such as a microcontroller or the like.

The power supply controller 50 controls charge to the storage circuit 10 by the charge circuit 20, using the charge control signal CTL1. Also, the power supply controller 50 controls power supply to the load device 200 of the boosting circuit 30, using the boosting control signal CTL2. The power supply controller 50 controls the equalization process of the equalization and discharge circuit 40, using the SW1 control signal CTL3 or the SW2 control signal CTL4.

The power supply controller 50 controls the discharge process of the equalization and discharge circuit 40, using the SW1 control signal CTL3 and the SW2 control signal CTL4. The power supply controller 50 controls the load driving circuit 220 using a driving control signal CTL5.

The power supply controller 50 includes a timer configured to measure time. The power supply controller 50 uses the timer and computes the time using the number of counts from the start of a timer count to the stop thereof.

The vehicle controller 300 is connected to the power supply controller 50. The vehicle controller 300 is, for example, an ECU (Electronic Control Unit). The power supply controller 50 receives an input from the vehicle controller 300, and the input is various signals CTLh, such as whether the vehicle is in a stopped state or in a used state, and the like. The power supply controller 50 outputs a state, information, and the like of the power supply controller 50 to the vehicle controller 300.

The stopped state is a state where the engine is stopped, and the operations of systems, such as an electric latch and the like, are stopped. In the stopped state, the systems of the vehicle are in a low-power consumption mode. The stopped state includes a state where the vehicle is parked and a state where the vehicle is stored. The used state is a state where the engine is in operation or the engine can be started up, i.e., a state where the systems, such as an electric latch, are in operation.

<Processing Procedure of Power Supply Device 1>

Figure 3:
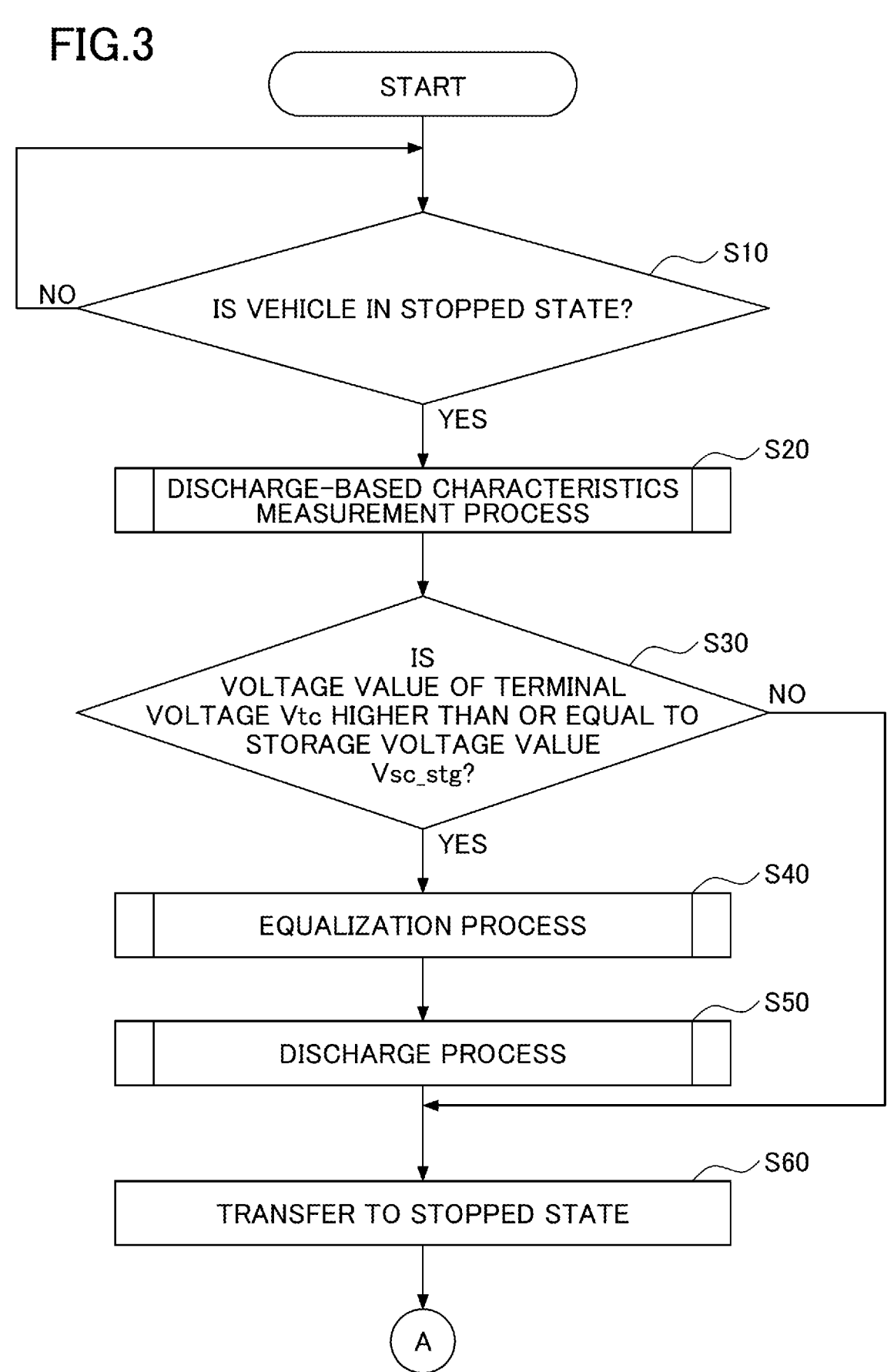
FIG. 3 is a flowchart illustrating a processing procedure of the power supply device according to the first embodiment.

Next, the processing procedure of the power supply device 1 will be described. FIG. 3 and FIG. 4 are a flowchart illustrating the processing procedure of the power supply device 1 according to the first embodiment. In this description, the vehicle including the power supply device 1 is in the used state before start of the process.

Upon the start of the process, the power supply controller 50 obtains information on the states of the vehicle from the vehicle controller 300, such as whether the vehicle is in the used state or in the stopped state. The power supply controller 50 determines whether or not the vehicle is in the stopped state (step S10).

When the vehicle is not in the stopped state (NO in step S10), the power supply controller 50 repeats step S10.

When the vehicle is in the stopped state (YES in step S10), the power supply controller 50 performs the discharge-based characteristics measurement process (step S20).

[Discharge-based Characteristics Measurement Process]

Figure 5:
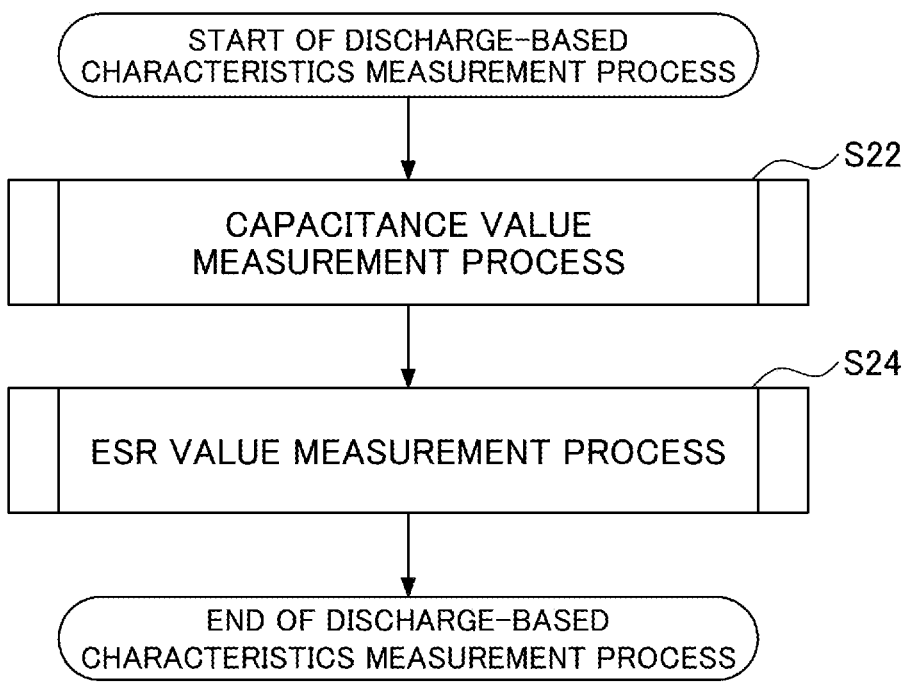
FIG. 5 is a flowchart illustrating a discharge-based characteristics measurement process of the power supply device according to the first embodiment.

The discharge-based characteristics measurement process of the storage circuit 10 in the power supply controller 50 of the power supply device 1 according to the first embodiment will be described. FIG. 5 is a flowchart illustrating the discharge-based characteristics measurement process of the power supply device 1 according to the first embodiment. The discharge-based characteristics measurement process includes a capacitance value measurement process (step S22) and an equivalent series resistance value measurement process (ESR value measurement process) (step S24). The power supply controller 50 determines the capacitance value and the equivalent series resistance value of the storage circuit 10, as the characteristics of the storage circuit 10.

[Capacitance Value and Equivalent Series Resistance Value of Storage Circuit 10]

Figure 6:
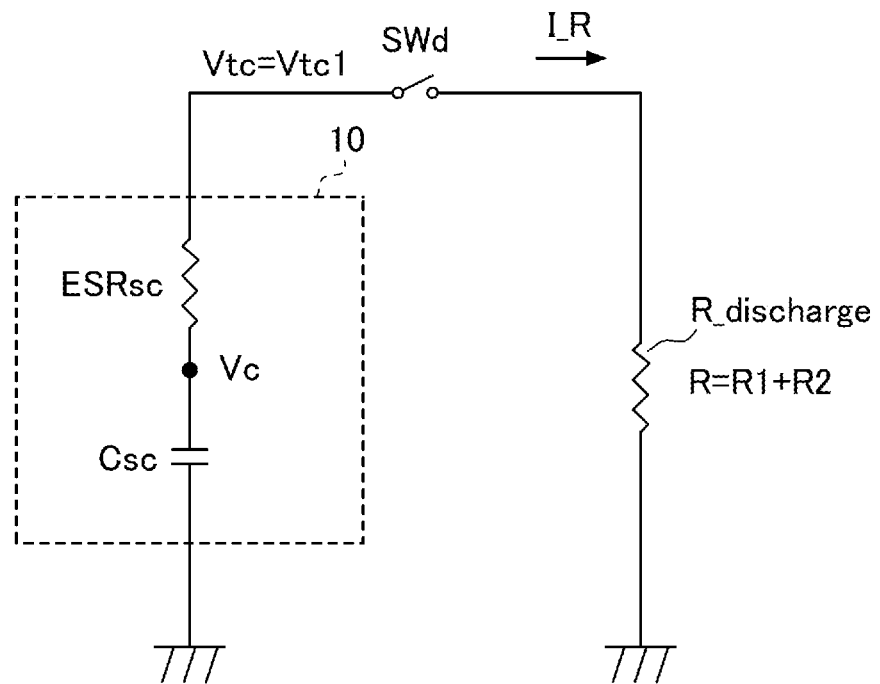
FIG. 6 is an equivalent circuit diagram of a circuit configured to perform the discharge-based characteristics measurement process of a storage circuit in the power supply device according to the first embodiment.

The characteristics of the storage circuit 10 in the power supply device 1 according to the first embodiment will be described. FIG. 6 is an equivalent circuit diagram of a circuit configured to perform the discharge-based characteristics measurement process of the storage circuit 10 in the power supply device 1 according to the first embodiment.

In the storage circuit 10 according to the present embodiment, the electrical double layer capacitor 11 and the electrical double layer capacitor 12 that are connected in series, are equivalently regarded as one capacitor having a capacitance value Csc and one resistor having a resistance value ESRsc and connected in series to the one capacitor. Further, the characteristics of the storage circuit 10 are determined using the capacitance value Csc and the resistance value ESRsc.

In addition, the evaluation is performed by regarding the resistor 45 and the resistor 46 that are connected in series, as a discharging resistor R_discharge having a resistance value R (=resistance value R1+resistance value R2). That is, the resistance value R, obtained by adding the resistance value R1 of the resistor 45 and the resistance value R2 of the resistor 46, is set as the resistance value of the discharging resistor R_discharge.

Moreover, in the characteristics measurement process, the switch SW1 and the switch SW2 are turned on (closed) or turned off (opened) simultaneously. Therefore, turning on (closing) or turning off (opening) the switch SW1 and the switch SW2 simultaneously is equivalently expressed by turning on (closing) or turning off (opening) a switch SWd.

[Measurement of Capacitance Value of Storage Circuit 10]

Characteristic degradation of the electrical double layer capacitor progresses with the use thereof. In a case where the degradation of the electrical double layer capacitor progresses and the capacitance value decreases, a hindrance of the supply of current to the motor may occur, for example, and the time during which the electrical double layer capacitor is usable as the backup power supply may become short, or unlatching of the latch may not become possible. Accordingly, in the power supply device 1 according to the first embodiment, the capacitance value of the electrical double layer capacitor is measured to monitor the capacitance value.

FIG. 7 is a flowchart of a capacitance value measurement process of the storage circuit 10 in the power supply device 1 according to the first embodiment. When performing this process, the charge circuit 20 and the boosting circuit 30 stop operating. That is, in this state, the storage circuit 10 is not charged by the power supply 100. In addition, in this state, the storage circuit 10 does not supply electric power to the load device 200. Moreover, when performing this process, desirably, the storage circuit 10 is in a state charged to a certain extent, such as a state where the charge is higher than or equal to 50% of a full charge, or preferably higher than or equal to 80% of the full charge.

A processing procedure of the power supply controller 50 of the power supply device 1 according to the first embodiment, and steps of a control method of the power supply device 1, will be described in conjunction with the flowchart of FIG. 7.

(Step S221)

First, the power supply controller 50 turns on (closes) the switch SW1 and the switch SW2. That is, the switch SWd is turned on (closed). When the switch SW1 and the switch SW2 are turned on (closed), the discharging resistor R_discharge is connected to the storage circuit 10. When the discharging resistor R_discharge is connected to the storage circuit 10, the electric power stored in the storage circuit 10 flows to the ground with a current I_R via the discharging resistor R_discharge. When the electric power stored in the storage circuit 10 flows to the ground with the current I_R, the terminal voltage Vtc of the storage circuit 10 starts decreasing.

(Step S222)

Next, the power supply controller 50 measures the terminal voltage Vtc of the storage circuit 10. Further, the power supply controller 50 records (obtains) the measured voltage value of the terminal voltage Vtc, as a start voltage value V1. Simultaneously, the timer count is started.

(Step S223)

Next, the power supply controller 50 determines whether or not the voltage value of the terminal voltage Vtc of the storage circuit 10 is lower than or equal to an end voltage value V2 that is set to a predetermined value. When the voltage value of the terminal voltage Vtc of the storage circuit 10 is higher than the predetermined end voltage value V2 (NO in step S223), the power supply controller 50 performs step S223 again. When the voltage value of the terminal voltage Vtc of the storage circuit 10 is lower than or equal to the predetermined end voltage value V2 (YES in step S223), the power supply controller 50 causes the process to proceed to step S224. The end voltage value V2 is set to a value lower than the start voltage value V1.

(Step S224)

Next, the power supply controller 50 stops the timer count, and records the counted value. Further, the power supply controller 50 computes, and records, a time T from the start of the timer count from the counted value to the stop of the timer count. The process of step S224 is desirably performed simultaneously as step S223, or as quickly as possible within a range executable by the power supply controller 50 after performing step S223.

(Step S225)

Next, the power supply controller 50 turns off (opens) the switch SW1 and the switch SW2. When the switch SW1 and the switch SW2 are turned off (opened), the discharging resistor R_discharge is disconnected from the storage circuit 10.

(Step S226)

Next, the power supply controller 50 computes the capacitance value Csc according to Formula 1, using the measured start voltage value V1 and end voltage value V2, and the time T. The resistance value R is the resistance value of the discharge resistance R_discharge. Ln denotes a natural logarithm.

[Formula 1]

$$Csc = -T/(R \times \mathrm{Ln}\,(V2/V1)) \qquad \text{(Formula 1)}$$

For example, in step S223, when the voltage value of the terminal voltage Vtc of the storage circuit 10 becomes lower than or equal to the end voltage value V2, the terminal voltage Vtc of the storage circuit 10 may be measured again and set as the end voltage value V2. Alternatively, a set time Ts may be set first, and the voltage value of the terminal voltage Vtc of the storage circuit 10 after the time Ts passes after the switch SW1 and the switch SW2 are turned on (closed) and the terminal voltage Vtc is measured in step S222, may be measured as the end voltage value V2. When the time Ts is set, the time T in Formula 1 is the time Ts.

The power supply device 1 according to the present embodiment can measure the capacitance value of the storage circuit 10 during discharge in which a current is discharged from the storage circuit 10. In addition, the power supply device 1 according to the present embodiment can monitor the characteristic degradation of the electrical double layer capacitor included in the storage circuit 10, by measuring the capacitance value of the storage circuit 10.

The equalization and discharge circuit 40 of the power supply device 1 according to the present embodiment also operates as a discharge circuit configured to discharge the energy stored in the storage circuit 10. Accordingly, the power supply device 1 according to the present embodiment can check the operation of the discharge circuit by measuring the capacitance value of the storage circuit 10.

The start voltage value V1 is an example of a first voltage value, and the end voltage value V2 is an example of a second voltage value.

[Measurement of Equivalent Series Resistance Value of Storage Circuit 10]

The characteristic degradation of the electrical double layer capacitor progresses with the use thereof. When the degradation of the electrical double layer capacitors progresses and the equivalent series resistance value increases, a hindrance of the supply of current to the motor may occur, for example, and unlatching of the latch may not become possible. Accordingly, in the power supply device 1 according to the present embodiment, the equivalent series resistance value of the electrical double layer capacitors is measured to monitor the equivalent series resistance value.

FIG. 8 is a flowchart of an equivalent series resistance value measurement process of the storage circuit 10 in the power supply device 1 according to the first embodiment. When performing this process, the charge circuit 20 and the boosting circuit 30 stop operating. That is, in this state, the storage circuit 10 is not charged by the power supply 100. In addition, in this state, the storage circuit 10 does not supply electric power to the load device 200. Moreover, when performing this process, desirably, the storage circuit 10 is in a state charged to a certain extent, such as a state where the charge is higher than or equal to 50% of a full charge, or preferably higher than or equal to 80% of the full charge.

The processing procedure of the power supply controller 50 of the power supply device 1 according to the present embodiment, and the steps of the control method of the power supply device 1, will be described in conjunction with the flowchart of FIG. 8.

(Step S241)

First, the power supply controller 50 turns on (closes) the switch SW1 and the switch SW2, i.e., the switch SWd. When the switch SW1 and the switch SW2 are turned on (closed), the discharging resistor R_discharge is connected to the storage circuit 10. When the discharging resistor R_discharge is connected to the storage circuit 10, the electric power stored in the storage circuit 10 flows to the ground with the current I_R via the discharging resistor R_discharge. When the electric power stored in the storage circuit 10 flows to the ground with the current I_R, the terminal voltage Vtc of the storage circuit 10 starts decreasing.

(Step S242)

Next, the power supply controller 50 measures the terminal voltage Vtc of the storage circuit 10. Further, the power supply controller 50 stores (obtains) the measured voltage value of the terminal voltage Vtc, as an on-time voltage value Vsc_on.

(Step S243)

Next, the power supply controller 50 turns off (opens) the switch SW1 and the switch SW2, immediately after measuring the terminal voltage Vtc of the storage circuit 10 in step S242. When the switch SW1 and the switch SW2 are turned off (opened), the discharging resistor R_discharge is disconnected from the storage circuit 10. The process of step S243 is desirably performed simultaneously as step S242, or as quickly as possible within a range executable by the power supply controller 50 after performing step S242.

(Step S244)

Next, after the switch SW1 and the switch SW2 are turned off (opened), the power supply controller 50 measures the terminal voltage Vtc of the storage circuit 10. Further, the power supply controller 50 stores (obtains) the measured voltage value of the terminal voltage Vtc, as an off-time voltage value Vsc_off.

(Step S245)

Next, the power supply controller 50 computes an equivalent series resistance value ESR according to Formula 2, using the measured on-time voltage value Vsc_on and off-time voltage value Vsc_off. The resistance value R is the resistance value of the discharge resistance R_discharge.

[Formula 2]

$$ESR = \qquad \qquad \qquad \qquad \text{(Formula 2)}$$
$$(\text{Vsc\_off} - \text{Vsc\_on})R/\text{Vsc\_on} = R(\text{Vsc\_off}/\text{Vsc\_on} - 1)$$

The power supply device 1 according to the present embodiment can measure the equivalent series resistance value of the storage circuit 10, during the discharge in which the current is discharged from the storage circuit 10. In addition, the power supply device 1 according to the present embodiment can monitor the characteristic degradation of the electrical double layer capacitor included in the storage circuit 10, by measuring the equivalent series resistance value of the storage circuit 10.

Moreover, the equalization and discharge circuit 40 of the power supply device 1 according to the present embodiment operates as the discharge circuit configured to discharge the energy stored in the storage circuit 10. Therefore, the power supply device 1 according to the present embodiment can check the operation of the discharge circuit, by measuring the equivalent series resistance value of the storage circuit 10.

[Simultaneous Measurement of Capacitance Value and Equivalent Series Resistance Value of Storage Circuit 10]

The power supply device 1 according to the first embodiment can simultaneously measure the capacitance value and the equivalent series resistance value of the electrical double layer capacitor.

FIG. 9 is a flowchart of a capacitance value and equivalent series resistance value measurement process (characteristics measurement process) of the storage circuit 10 in the power supply device 1 according to the first embodiment. When performing this process, the charge circuit 20 and the boosting circuit 30 stop operating. That is, in this state, the storage circuit 10 is not charged by the power supply 100. In addition, in this state, the storage circuit 10 does not supply electric power to the load device 200. When performing this process, desirably, the storage circuit 10 is in a state charged to a certain extent, such as a state where the charge is higher than or equal to 50% of a full charge, or preferably higher than or equal to 80% of the full charge.

The processing procedure of the power supply controller 50 of the power supply device 1 and the steps of the control method of the power supply device 1 according to the present embodiment, will be described in conjunction with the flowchart of FIG. 9.

(Step S261)

First, the power supply controller 50 turns on (closes) the switch SW1 and the switch SW2, i.e., the switch SWd. When the switch SW1 and the switch SW2 are turned on (closed), the discharging resistor R_discharge is connected to the storage circuit 10. When the discharging resistor R_discharge is connected to the storage circuit 10, the electric power stored in the storage circuit 10 flows to the ground with the current I_R via the discharging resistor R_discharge. When the electric power stored in the storage circuit 10 flows to the ground with the current I_R, the terminal voltage Vtc of the storage circuit 10 starts decreasing.

(Step S262)

Next, the power supply controller 50 measures the terminal voltage Vtc of the storage circuit 10. Further, the power supply controller 50 records (obtains) the measured voltage value of the terminal voltage Vtc, as a start voltage value V1. Also, the timer count is started.

(Step S263)

Next, the power supply controller 50 determines whether or not the voltage value of the terminal voltage Vtc of the storage circuit 10 is lower than or equal to an end voltage value V2 that is set to a predetermined value. When the voltage value of the terminal voltage Vtc of the storage circuit 10 is higher than the predetermined end voltage value V2 (NO in step S263), the power supply controller 50 performs step S263 again. When the voltage value of the terminal voltage Vtc of the storage circuit 10 is lower than or equal to the predetermined end voltage value V2 (YES in step S263), the power supply controller 50 causes the process to proceed to step S264. The end voltage value V2 is set to a value lower than the start voltage value V1.

(Step S264)

Next, the power supply controller 50 stops the timer count, and records the counted value. Further, the power supply controller 50 computes, and records, a time T from the start of the timer count from the counted value to the stop of the timer count. The process of step S264 is desirably performed simultaneously as step S263, or as quickly as possible within a range executable by the power supply controller 50 after performing step S263.

For example, in step S263, when the voltage value of the terminal voltage Vtc of the storage circuit 10 becomes lower than or equal to the end voltage value V2, the terminal voltage Vtc of the storage circuit 10 may be measured again and set as the end voltage value V2. Alternatively, a set time Ts may be set first, and the voltage value of the terminal voltage Vtc of the storage circuit 10 after the time Ts passes after the switch SW1 and the switch SW2 are turned on (closed) and the terminal voltage Vtc is measured in step S262, may be measured as the end voltage value V2.

(Step S265)

Next, the power supply controller 50 turns off (opens) the switch SW1 and the switch SW2, immediately after step S264. When the switch SW1 and the switch SW2 are turned off (opened), the discharging resistor R_discharge is disconnected from the storage circuit 10. The process of step S265 is desirably performed simultaneously as step S264, or as quickly as possible within a range executable by the power supply controller 50 after performing step S264.

(Step S266)

Next, after the switch SW1 is turned off (opened), the power supply controller 50 measures the terminal voltage Vtc of the storage circuit 10. Further, the power supply controller 50 stores the measured voltage value of the terminal voltage Vtc, as an off-time voltage value V3.

(Step S267)

Next, the power supply controller 50 computes a capacitance value Csc according to Formula 1, using the measured start voltage value V1 and end voltage value V2, and the time T. The resistance value R is the resistance value of the discharge resistance R_discharge.

(Step S268)

Next, the power supply controller 50 computes an equivalent series resistance value ESR according to Formula 3, using the end voltage value V2 and the measured off-time voltage value V3. The resistance value R is the resistance value of the discharge resistance R_discharge.

[Formula 3]

$$ESR = (V3 - V2)R/V2 = R(V3/V2 - 1) \qquad \text{Formula 3}$$

The power supply device 1 according to the present embodiment can measure the capacitance value and the equivalent series resistance value of the storage circuit 10, during the discharge in which the current is discharged from the storage circuit 10. In addition, the power supply device 1 according to the present embodiment can monitor the characteristic degradation of the electrical double layer capacitor included in the storage circuit 10, by measuring the capacitance value and the equivalent series resistance value of the storage circuit 10.

<Measurement of Terminal voltage Vtc>

After completion of step S20, the power supply controller 50 determines whether or not the voltage value of the terminal voltage Vtc is higher than or equal to a storage voltage value Vsc_stg (step S30).

When the voltage value of the terminal voltage Vtc is higher than or equal to the storage voltage value Vsc_stg (YES in step S30), the process proceeds to an equalization process in step S40. When the voltage value of the terminal voltage Vtc is lower than the storage voltage value Vsc_stg (NO in step S30), the process proceeds to step S60.

[Equalization Process]

Figure 10:
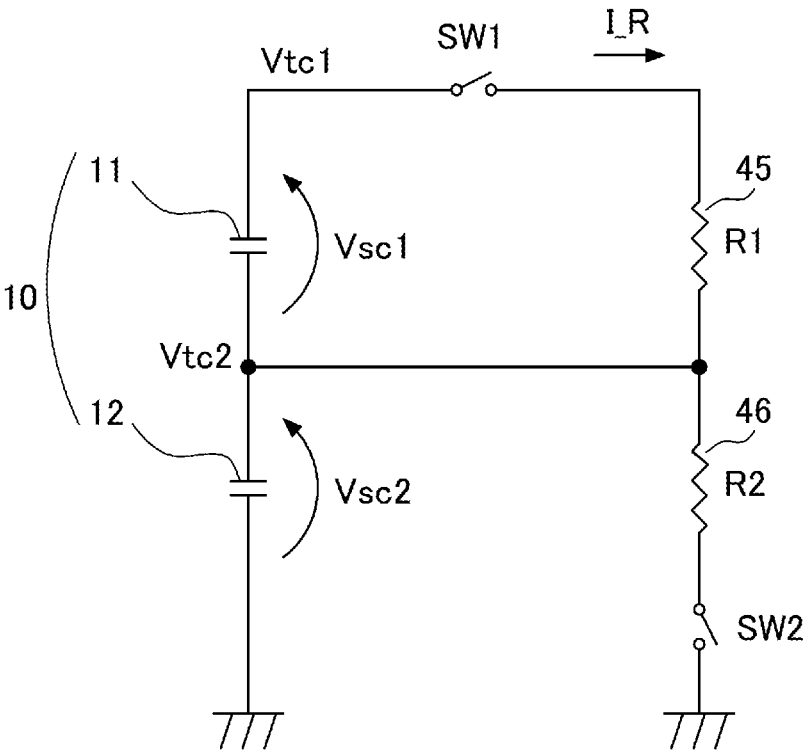
FIG. 10 is an equivalent circuit diagram of a circuit configured to perform an equalization process of the storage circuit in the power supply device according to the first embodiment.

Next, the equalization process in step S40 will be described. FIG. 10 is an equivalent circuit diagram of a circuit configured to perform the equalization process of the storage circuit 10 in the power supply device 1 according to the first embodiment.

Figure 11:
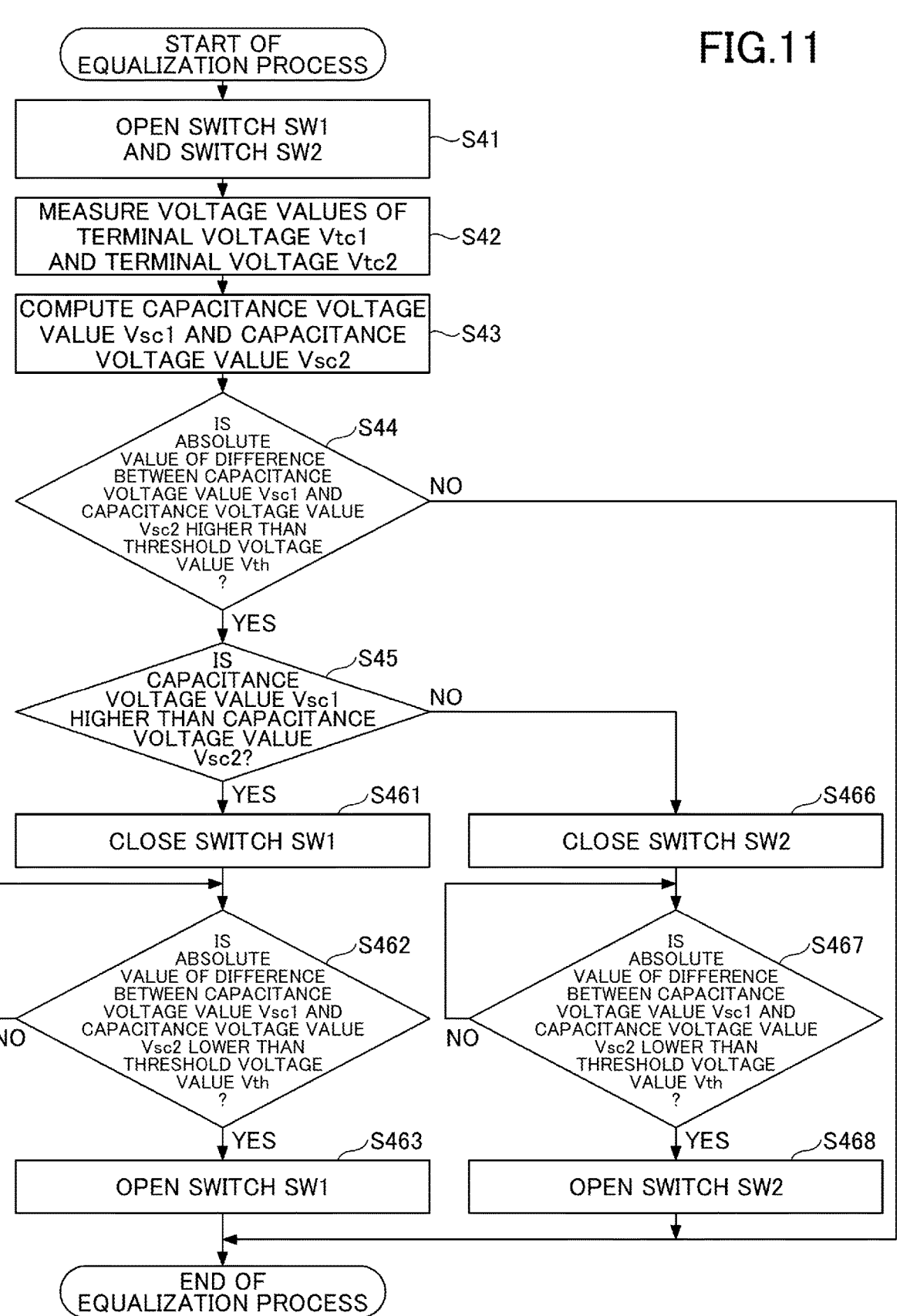
FIG. 11 is a flowchart of the equalization process of the storage circuit in the power supply device according to the first embodiment.

FIG. 11 is a flowchart of the equalization process of the storage circuit 10 in the power supply device 1 according to the first embodiment.

(Step S41)

When the equalization process is started, the power supply controller 50 turns off (opens) the switch SW1 and the switch SW2.

(Step S42)

Next, the power supply controller 50 measures the voltage values of the terminal voltage Vtc1 and the terminal voltage Vtc2.

(Step S43)

Next, the power supply controller 50 computes a capacitance voltage value Vsc1 of the electrical double layer capacitor 11 and a capacitance voltage value Vsc2 of the electrical double layer capacitor 12. Specifically, the capacitance voltage value Vsc1 is a voltage value obtained by subtracting the voltage value of the terminal voltage Vtc2 from the voltage value of the terminal voltage Vtc1. The capacitance voltage value Vsc2 is the voltage value of the terminal voltage Vtc2.

(Step S44)

Next, the power supply controller 50 determines whether or not an absolute value of a difference between the capacitance voltage value Vsc1 and the capacitance voltage value Vsc2 is higher than a threshold voltage value Vth. When the absolute value of the difference between the capacitance voltage value Vsc1 and the capacitance voltage value Vsc2 is higher than the threshold voltage value Vth (YES in step S44), the power supply controller 50 determines that the equalization process is needed. When the absolute value of the difference between the capacitance voltage value Vsc1 and the capacitance voltage value Vsc2 is lower than or equal to the threshold voltage value Vth (NO in step S44), the equalization process is ended.

(Step S45)

Next, the power supply controller 50 determines whether or not the capacitance voltage value Vsc1 is higher than the capacitance voltage value Vsc2. When the capacitance voltage value Vsc1 is higher than the capacitance voltage value Vsc2 (YES in step S45), the power supply controller 50 causes the process to proceed to step S461. When the capacitance voltage value Vsc1 is lower than the capacitance voltage value Vsc2 (NO in step S45), the power supply controller 50 causes the process to proceed to step S466.

(Step S461)

When the capacitance voltage value Vsc1 is higher than the capacitance voltage value Vsc2 (YES in step S45), the power supply controller 50 turns on (closes) the switch SW1. When the switch SW1 is turned on (closed), the charge stored in the electrical double layer capacitor 11 is discharged by the resistor 45. Therefore, the capacitance voltage value Vsc1 gradually decreases.

(Step S462)

The power supply controller 50 determines whether or not the absolute value of the difference between the capacitance voltage value Vsc1 and the capacitance voltage value Vsc2 is lower than the threshold voltage value Vth. When the absolute value of the difference between the capacitance voltage value Vsc1 and the capacitance voltage value Vsc2 is lower than the threshold voltage value Vth (YES in step S462), the power supply controller 50 causes the process to proceed to step S463. When the absolute value of the difference between the capacitance voltage value Vsc1 and the capacitance voltage value Vsc2 is higher than or equal to the threshold voltage value Vth (NO in step S462), the power supply controller 50 repeats the process of step S462. The threshold voltage value Vth may be a voltage range having a certain width, rather than a predetermined voltage value.

(Step S463)

When the absolute value of the difference between the capacitance voltage value Vsc1 and the capacitance voltage value Vsc2 is lower than the threshold voltage value Vth (YES in step S462), the power supply controller 50 turns off (opens) the switch SW1. When the switch SW1 is turned off (opened), the electrical double layer capacitor 11 is disconnected from the resistor 45. When such a voltage range is used as the threshold voltage value Vth, the switch SW1 may be turned off (opened) when the difference therebetween is within that range.

(Step S466)

When the capacitance voltage value Vsc1 is lower than the capacitance voltage value Vsc2 (NO in step S45), the power supply controller 50 turns on (closes) the switch SW2. When the switch SW2 is turned on (closed), the charge stored in the electrical double layer capacitor 12 is discharged by the resistor 46. Therefore, the capacitance voltage value Vsc2 gradually decreases.

(Step S467)

The power supply controller 50 determines whether or not the absolute value of the difference between the capacitance voltage value Vsc1 and the capacitance voltage value Vsc2 is lower than the threshold voltage value Vth. When the absolute value of the difference between the capacitance voltage value Vsc1 and the capacitance voltage value Vsc2 is lower than the threshold voltage value Vth (YES in step S467), the power supply controller 50 causes the process to proceed to step S468. When the absolute value of the difference between the capacitance voltage value Vsc1 and the capacitance voltage value Vsc2 is higher than or equal to the threshold voltage value Vth (NO in step S467), the power supply controller 50 repeats the process of step S467. The threshold voltage value Vth may be a voltage range having a certain width, rather than a predetermined voltage value.

(Step S468)

When the absolute value of the difference between the capacitance voltage value Vsc1 and the capacitance voltage value Vsc2 is lower than the threshold voltage value Vth (YES in step S467), the power supply controller 50 turns off (opens) the switch SW2. When the switch SW2 is turned off (opened), the electrical double layer capacitor 12 is disconnected from the resistor 46. When such a voltage range is used as the threshold voltage value Vth, the switch SW2 may be turned off (opened) when the difference therebetween is within that range.

The power supply device 1 according to the present embodiment compares the capacitance voltage value Vsc1 and the capacitance voltage value Vsc2, and discharges the electrical double layer capacitor having the higher capacitance voltage value. Therefore, it is possible to reduce the time and electric power necessary for the equalization process, compared to constant operation with a resistance value used in an equalization circuit being set to be high, equalization operation by simultaneously turning on SW1 and SW2 while continuing charging with a resistance value being set to be low, intermittently turning on or off SWs of an equalization circuit at appropriate timings and independently of each other with a resistance value used in the equalization circuit being set to be low, or the like.

[Discharge Process]

Figure 12:
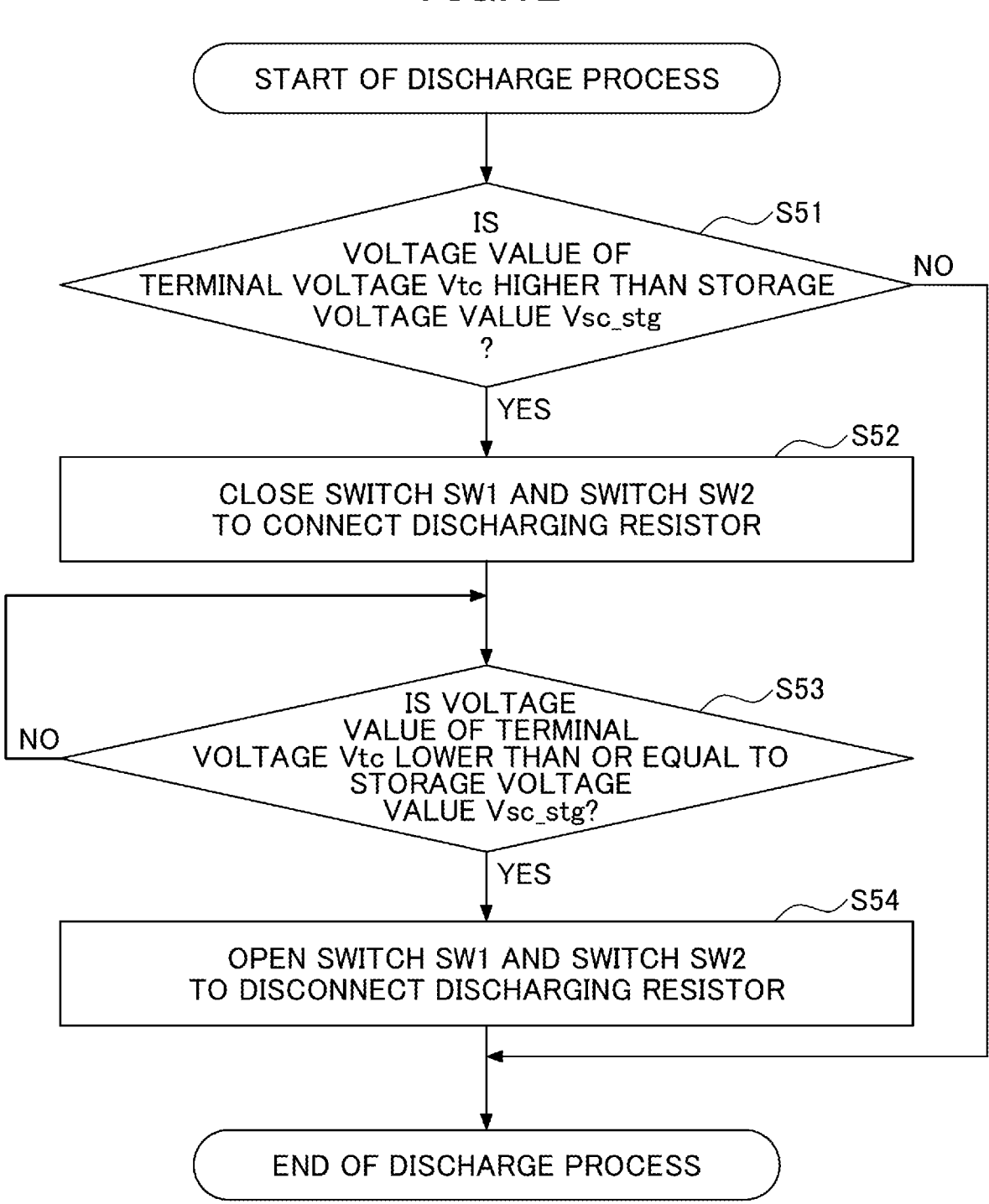
FIG. 12 is a flowchart of a discharge process of the storage circuit in the power supply device according to the first embodiment.

Next, the discharge process of step S50 will be described. FIG. 12 is a flowchart of the discharge process of the storage circuit 10 in the power supply device 1 according to the first embodiment. The discharge process will be described using the equivalent circuit diagram of FIG. 10. In the discharge process, the storage voltage value Vsc_stg is adjusted to be lower than or equal to a value that is lower than the below-described operation voltage value Vact in a case where the voltage value of a voltage according to the storage circuit 10 is usually used.

(Step S51)

First, the power supply controller 50 measures the terminal voltage Vtc. Further, the power supply controller 50 determines whether or not the voltage value of the measured terminal voltage Vtc is higher than the storage voltage value Vsc_stg. When the voltage value of the terminal voltage Vtc is higher than the storage voltage value Vsc_stg (YES in step S51), the power supply controller 50 causes the process to proceed to step S52. When the voltage value of the terminal voltage Vtc is lower than or equal to the storage voltage value Vsc_stg (NO in step S51), the discharge process is ended, as the storage circuit 10 is regarded as being sufficiently discharged to have a low voltage.

(Step S52)

Next, the power supply controller 50 turns on (closes) the switch SW1 and the switch SW2, and connects the resistor 45 and the resistor 46, which are discharge resistors, to the storage circuit 10, i.e., the electrical double layer capacitor 11 and the electrical double layer capacitor 12. That is, the switch SW1 and the switch SW2 create electrical conduction of a path from the node N1 to the ground via the resistor 45 and the resistor 46. When the resistor 45 and the resistor 46, which are discharge resistors, are connected to the storage circuit 10, the charge accumulated in each of the electrical double layer capacitor 11 and the electrical double layer capacitor 12 is discharged. Therefore, the terminal voltage Vtc gradually decreases.

(Step S53)

Next, the power supply controller 50 measures the terminal voltage Vtc. Further, the power supply controller 50 determines whether or not the voltage value of the terminal voltage Vtc is lower than or equal to the storage voltage value Vsc_stg. When the voltage value of the terminal voltage Vtc is higher than the storage voltage value Vsc_stg (NO in step S53), the power supply controller 50 repeats step S53. When the voltage value of the terminal voltage Vtc is lower than or equal to the storage voltage value Vsc_stg (YES in step S53), the power supply controller 50 causes the process to proceed to step S54.

(Step S54)

Next, the power supply controller 50 turns off (opens) the switch SW1 and the switch SW2, and disconnects the resistor 45 and the resistor 46, which are discharge resistors, from the storage circuit 10, i.e., the electrical double layer capacitor 11 and the electrical double layer capacitor 12. That is, the switch SW1 and the switch SW2 open the path from the node N1 to the ground via the resistor 45 and the resistor 46. Then, the power supply controller 50 ends the discharge process.

The electrical double layer capacitor is degraded with long-term use thereof. Degradation of the electrical double layer capacitor varies with an operation temperature and a capacitance voltage. For example, a lower voltage applied to the electrical double layer capacitor delays a progress of degradation of the electrical double layer capacitor.

According to the power supply device 1 according to the present embodiment, when the state of interest is determined to transfer to a stopped state, the voltage applied to the electrical double layer capacitor is adjusted to be lower than or equal to the storage voltage value Vsc_stg. Thereby, degradation of the electrical double layer capacitor can be suppressed.

The above-described discharge process is not limiting for the discharge of the electrical double layer capacitor. The discharge of the electrical double layer capacitor may be performed by the equalization process or the like, or may be performed by a process of supplying electric power to a load, such as the load device 200 or the like (power supply process). In other words, when the power supply controller 50 detects transfer to a suspended state, the power supply controller 50 may perform the discharge of the storage circuit 10 by performing at least one process of the power supply process, the discharge process, or the equalization process. The power supply controller 50 performs the discharge of the storage circuit 10 by appropriately performing the power supply process, the discharge process, and the equalization process in any combination. For example, the power supply controller 50 first performs the discharge process until the voltage of the terminal voltage Vtc reaches a predetermined standard voltage value (first standard voltage value) and then further performs the power supply process until the voltage of the terminal voltage Vtc reaches a lower voltage value (second standard voltage value).

Moreover, when performing the discharge process, discharge and stop of the discharge may be repeatedly performed a plurality of times. In one procedure, after a certain period passes from the start of discharge, the discharge is stopped. Then, the terminal voltage Vtc is measured. When the measured terminal voltage Vtc is higher than the storage voltage value Vsc_stg, the discharge is started again and then stopped. This procedure may be repeatedly performed a plurality of times.

The discharge process is not limited to the discharge process using the equalization and discharge circuit 40. The discharge process may use a discharge circuit including a discharge resistor in addition to the equalization and discharge circuit 40.

[Transfer to Stopped State]

Upon completion of the discharge process, a vehicle transfers to a stopped state (step S60). The stopped state is a state where systems, such as an electric latch and the like, stop operating, and the entire vehicle is in a low-power consumption mode. In the transfer to the stopped state, the power supply controller 50 obtains information on states of the vehicle from a vehicle controller 300, and the information includes whether the vehicle is in the used state or in the stopped state, and the like. The power supply controller 50 determines whether or not the vehicle is in the used state (step S70).

When the power supply controller 50 determines that the vehicle is not in the used state (NO in step S70), the power supply controller 50 repeats step S70. When the power supply controller 50 determines that the vehicle is in the used state (YES in step S70), the power supply controller 50 causes the process to proceed to step S75. Determination as to whether or not the vehicle is in the used state when the vehicle is not in the used state, may be performed based on start-up information given to the power supply controller 50 from the vehicle controller 300 or the like, vehicle information, and the like, instead of repeated determination in step S70 performed by the power supply controller 50.

(Step S75)

The power supply controller 50 measures the terminal voltage Vtc. Further, the power supply controller 50 determines whether or not the voltage value of the terminal voltage Vtc is lower than a threshold voltage value Vsc_th2. When the voltage value of the terminal voltage Vtc is higher than or equal to the threshold voltage value Vsc_th2 (NO in step S75), the power supply controller 50 causes the process to proceed to step S90. When the voltage value of the terminal voltage Vtc is lower than the threshold voltage value Vsc_th2 (YES in step S75), the power supply controller 50 causes the process to proceed to step S80.

In the stopped state, the terminal voltage Vtc of each of the electrical double layer capacitor 11 and the electrical double layer capacitor 12 decreases over time due to leakage current and the like of the circuit and the electrical double layer capacitor. Therefore, by measuring the terminal voltage Vtc of the storage circuit 10, it is possible to estimate a period for which the vehicle was in the stopped state.

For example, when the voltage value of the terminal voltage Vtc of the storage circuit 10 is the threshold voltage value Vsc_th2, the power supply controller 50 determines that the period for which the vehicle was in the stopped state is the threshold period. That is, when the voltage value of the terminal voltage Vtc is lower than the threshold voltage value Vsc_th2, the power supply controller 50 determines that the period for which the vehicle was in the stopped state is longer than the threshold period.

When the period for which the vehicle was in the stopped state becomes longer, the characteristics of the electrical double layer capacitor 11 and the electrical double layer capacitor 12 may be different from the characteristics measured in step S20. The power supply device 1 of the present embodiment measures characteristics of the storage circuit 10 by regarding that the stopped state of the vehicle continued for a long time when the voltage value of the terminal voltage Vtc is lower than the predetermined threshold voltage value Vsc_th2.

[Charge-Based Characteristics Measurement Process]

Figure 13:
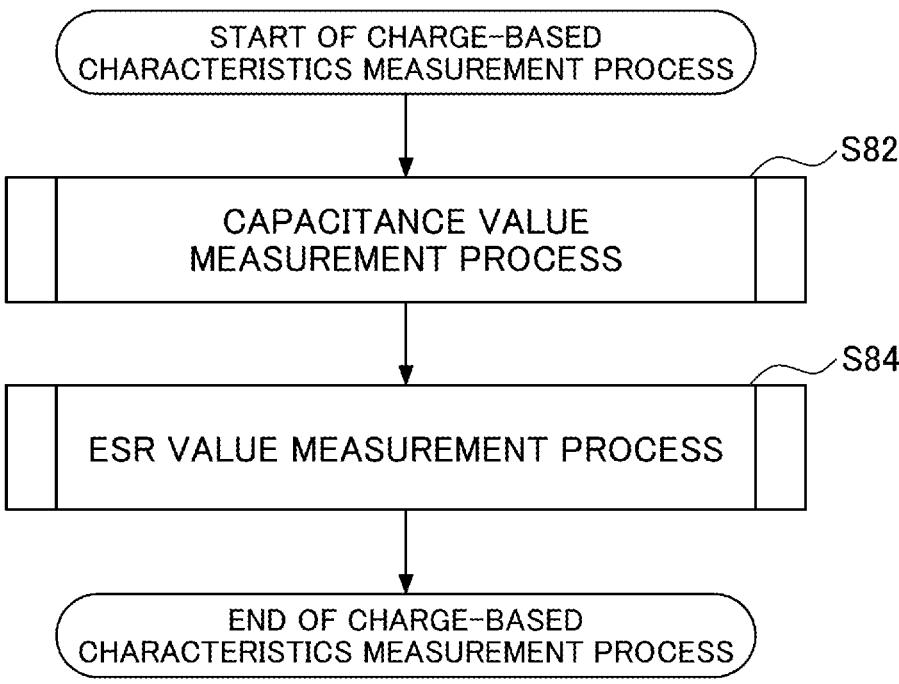
FIG. 13 is a flowchart illustrating a charge-based characteristics measurement process of the power supply device according to the first embodiment.

The charge-based characteristics measurement process of the storage circuit 10 in the power supply controller 50 of the power supply device 1 according to the first embodiment will be described. FIG. 13 is a flowchart illustrating the charge-based characteristics measurement process of the power supply device 1 according to the first embodiment. The charge-based characteristics measurement process includes the capacitance value measurement process (step S82) and the equivalent series resistance value measurement process (ESR value measurement process) (step S84). The power supply controller 50 determines the capacitance value and the equivalent series resistance value of the storage circuit 10, as the characteristics of the storage circuit 10.

[Capacitance Value and Equivalent Series Resistance Value of Storage Circuit 10]

Figure 14:
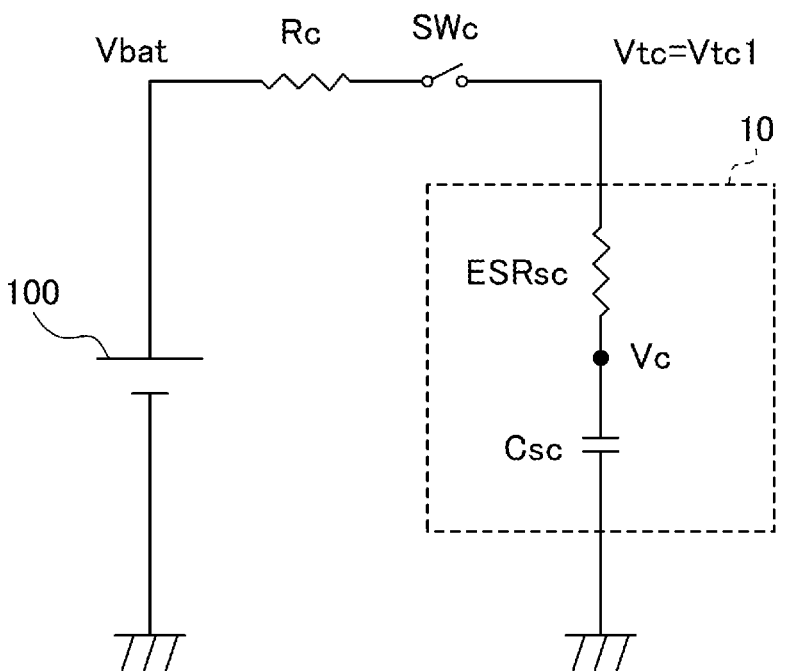
FIG. 14 is an equivalent circuit diagram of a circuit configured to perform the charge-based characteristics measurement process of the storage circuit in the power supply device according to the first embodiment.

The characteristics of the storage circuit 10 in the power supply device 1 according to the first embodiment will be described. FIG. 14 is an equivalent circuit diagram of a circuit configured to perform the charge-based characteristics measurement process of the storage circuit 10 in the power supply device 1 according to the first embodiment.

In the storage circuit 10 of the present embodiment, the electrical double layer capacitor 11 and the electrical double layer capacitor 12 that are connected in series, are equivalently regarded as one capacitor having a capacitance value Csc and one resistor having a resistance value ESRsc and connected in series to the one capacitor. Further, the characteristics of the storage circuit 10 are determined using the capacitance value Csc and the resistance value ESRSC.

In the storage circuit 10 according to the first embodiment, the storage circuit 10 is charged by a constant voltage source. The power supply 100 is the constant voltage source. The storage circuit 10 is charged at a constant voltage with a power supply voltage Vbat of the power supply 100. The storage circuit 10 includes a charging resistor Rc and a switch SWc between the power supply 100 and the storage circuit 10. For example, the charge circuit 20 includes the charging resistor Rc and the switch SWc.

[Measurement of Capacitance Value of Storage Circuit 10]

Figure 15:
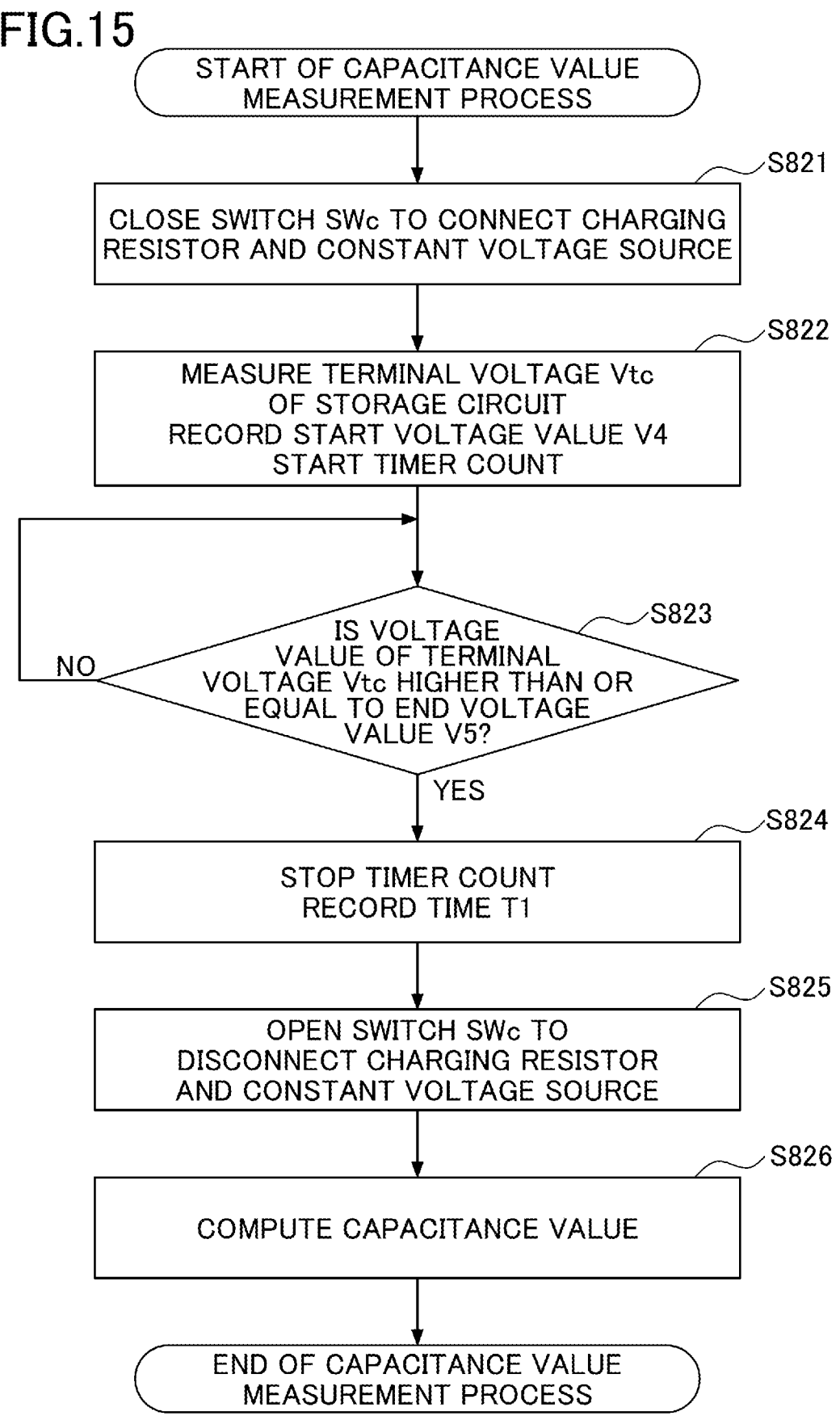
FIG. 15 is a flowchart of the capacitance value measurement process of the storage circuit in the power supply device according to the first embodiment.

FIG. 15 is a flowchart of the capacitance value measurement process of the storage circuit 10 in the power supply device 1 according to the first embodiment. When performing this process, the boosting circuit 30 and the equalization and discharge circuit 40 stop operating. That is, in this state, the storage circuit 10 does not perform an equalization discharge operation and power supply to the load device 200.

The processing procedure of the power supply controller 50 of the power supply device 1 according to the first embodiment and the steps of the control method for the power supply device 1, will be described in conjunction with the flowchart of FIG. 15.

(Step S821)

First, the power supply controller 50 turns on (closes) the switch SWc. When the switch SWc is turned on (closed), the power supply 100 and the charging resistor Rc are connected to the storage circuit 10. When the power supply 100 and the charging resistor Rc are connected to the storage circuit 10, the storage circuit 10 is charged by the power supply 100 via the charging resistor Rc. When the storage circuit 10 is charged, the terminal voltage Vtc of the storage circuit 10 starts increasing.

(Step S822)

Next, the power supply controller 50 measures the terminal voltage Vtc of the storage circuit 10. Further, the power supply controller 50 records (obtains) the measured voltage value of the terminal voltage Vtc, as a start voltage value V4. Also, the timer count is started.

(Step S823)

Next, the power supply controller 50 determines whether or not the voltage value of the terminal voltage Vtc of the storage circuit 10 is lower than an end voltage value V5 that is set to a predetermined value. When the voltage value of the terminal voltage Vtc of the storage circuit 10 is lower than the predetermined end voltage value V5 (NO in step S823), the power supply controller 50 performs step S823 again. When the voltage value of the terminal voltage Vtc of the storage circuit 10 is higher than or equal to the predetermined end voltage value V5 (YES in step S823), the power supply controller 50 causes the process to proceed to step S824. The end voltage value V5 is set to a value higher than the start voltage value V4.

(Step S824)

Next, the power supply controller 50 stops the timer count, and records the counted value. Further, the power supply controller 50 computes, and records, a time T1 from the start of the timer count from the counted value to the stop of the timer count. The process of step S824 is desirably performed simultaneously as step S823, or as quickly as possible within a range executable by the power supply controller 50 after performing step S823.

(Step S825)

Next, the power supply controller 50 turns off (opens) the switch SWc. When the switch SWc is turned off (opened), the power supply 100 and the charging resistor Rc are disconnected from the storage circuit 10.

(Step S826)

Next, the power supply controller 50 computes the capacitance value Csc according to Formula 4, using the measured start voltage value V4 and end voltage value V5, and the time T1. The resistance value R is the resistance value of the charging resistance Rc. Ln denotes a natural logarithm.

[Formula 4]

$$Csc = T1/(R \times (\mathrm{Ln}(Vbat - V4) - \mathrm{Ln}(Vbat - V5)))$$ Formula 4

For example, in step S823, when the voltage value of the terminal voltage Vtc of the storage circuit 10 becomes higher than or equal to the end voltage value V5, the terminal voltage Vtc of the storage circuit 10 may be measured again and set as the end voltage value V5. Alternatively, a set time Ts may be set first, and the voltage value of the terminal voltage Vtc of the storage circuit 10 after the time Ts passes after the switch SWc is turned on (closed) and the terminal voltage Vtc is measured in step S822, may be measured as the end voltage value V5. When the time Ts is set, the time T1 in Formula 4 is the time Ts.

The power supply device 1 according to the present embodiment can measure the capacitance value of the storage circuit 10 during a charge in which a current flows to the storage circuit 10. In addition, the power supply device 1 according to the present embodiment can monitor the characteristic degradation of the electrical double layer capacitor included in the storage circuit 10, by measuring the capacitance value of the storage circuit 10.

[Measurement of Equivalent Series Resistance Value of Storage Circuit 10]

Figure 16:
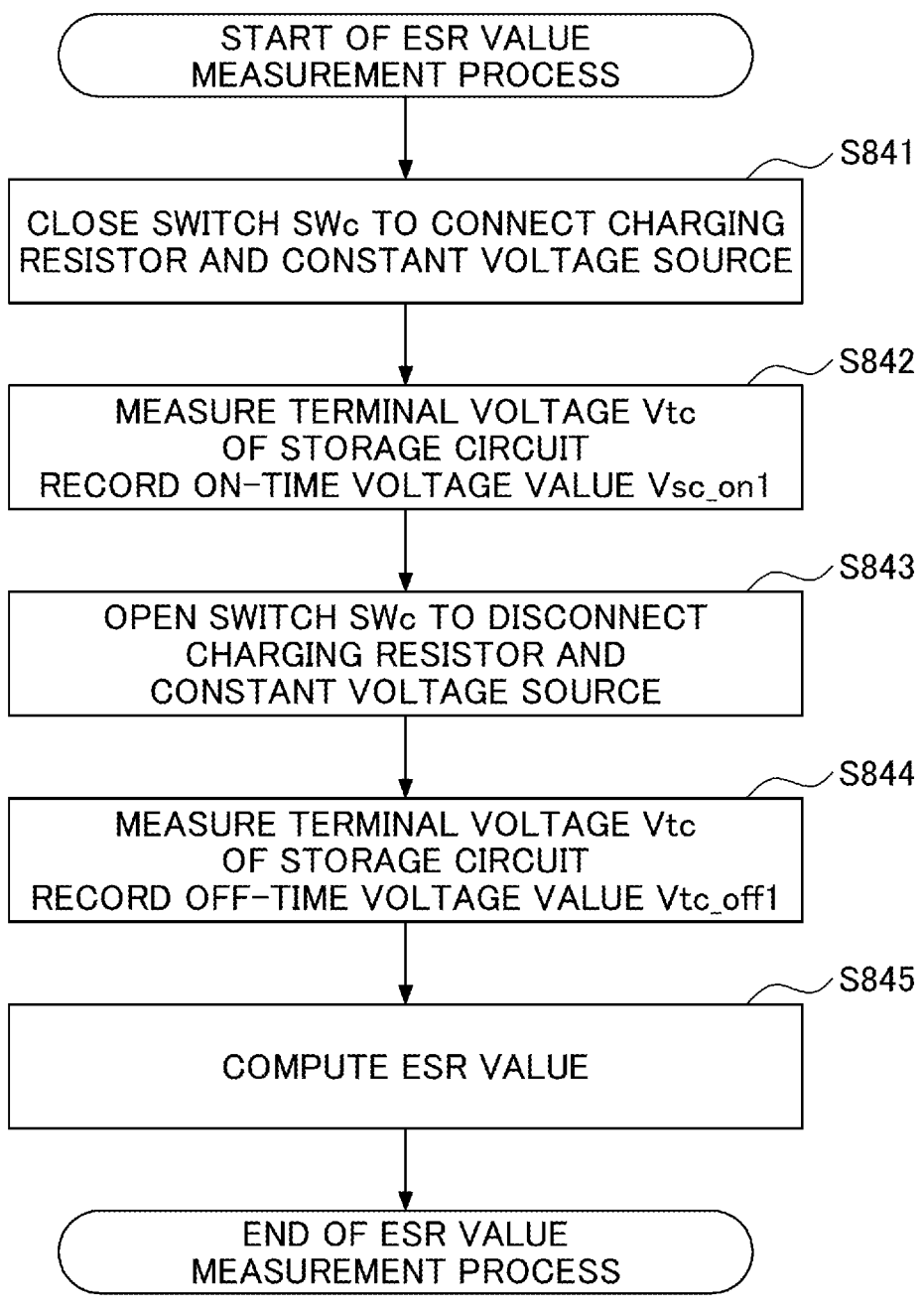
FIG. 16 is a flowchart of the equivalent series resistance value measurement process of the storage circuit in the power supply device according to the first embodiment.

FIG. 16 is a flowchart of the equivalent series resistance value measurement process of the storage circuit 10 in the power supply device 1 according to the first embodiment. When performing this process, the boosting circuit 30 and the equalization and discharge circuit 40 stop operating. That is, in this state, the storage circuit 10 does not perform an equalization discharge operation and power supply to the load device 200.

The processing procedure of the power supply controller 50 of the power supply device 1 according to the present embodiment and the steps of the control method for the power supply device 1, will be described in conjunction with the flowchart of FIG. 16.

(Step S841)

First, the power supply controller 50 turns on (closes) the switch SWc. When the switch SWc is turned on (closed), the power supply 100 and the charging resistor Rc are connected to the storage circuit 10. When the power supply 100 and the charging resistor Rc are connected to the storage circuit 10, the storage circuit 10 is charged by the power supply 100 via the charging resistor Rc. When the storage circuit 10 is charged, the terminal voltage Vtc of the storage circuit 10 starts increasing.

(Step S842)

Next, the power supply controller 50 measures the terminal voltage Vtc of the storage circuit 10. Further, the power supply controller 50 records (obtains) the measured voltage value of the terminal voltage Vtc, as an on-time voltage value Vsc_on1.

(Step S843)

Next, the power supply controller 50 turns off (opens) the switch SWc immediately after measuring the terminal voltage Vtc of the storage circuit 10 in step S842. When the switch SWc is turned off (opened), the power supply 100 and the charging resistor Rc are disconnected from the storage circuit 10. The process of step S843 is desirably performed simultaneously as step S842, or as quickly as possible within a range executable by the power supply controller 50 after performing step S842.

(Step S844)

Next, after the switch SWc is turned off (opened), the power supply controller 50 measures the terminal voltage Vtc of the storage circuit 10. Further, the power supply controller 50 records (obtains) the measured voltage value of the terminal voltage Vtc, as an off-time voltage value Vsc_off1.

(Step S845)

Next, the power supply controller 50 computes an equivalent series resistance value ESR according to Formula 5, using the measured on-time voltage value Vsc_on1 and off-time voltage value Vsc_off1. The resistance value R is the resistance value of the charging resistor Rc.

[Formula 5]

$$ESR = R(\mathrm{Vsc\_on1} - \mathrm{Vsc\_off1})/(V\,bat - \mathrm{Vsc\_on1}) \qquad \text{Formula 5}$$

The power supply device 1 according to the present embodiment can measure the capacitance value and the equivalent series resistance value of the storage circuit 10 during a charge in which a current flows to the storage circuit 10. In addition, the power supply device 1 according to the present embodiment can monitor the characteristic degradation of the electrical double layer capacitor included in the storage circuit 10, by measuring the capacitance value and the equivalent series resistance value of the storage circuit 10.

For example, even if the capacitance value and the equivalent series resistance value are measured in step S20, when the vehicle is left in the stopped state for a long time, the capacitance value and the equivalent series resistance value measured upon discharge may be ineffective. Thus, when it is determined in step S75 that the vehicle was in the stopped state for a long time by measuring the terminal voltage Vtc of the storage circuit 10, the capacitance value and the equivalent series resistance value are measured in step S80 upon transfer to the used state. By measuring the capacitance value and the equivalent series resistance value upon transfer to the used state, it is possible to accurately determine the capacitance value and the equivalent series resistance value after the transfer to the used state. Regarding measurement of the capacitance value and the equivalent series resistance value upon transfer to the used state, it is possible to obtain the capacitance value and the equivalent series resistance value by measurement upon charge by the charge circuit or measurement upon discharge by the discharge circuit, or both thereof.

Meanwhile, when the vehicle was in the stopped state for a short time, by using the capacitance value and the equivalent series resistance value measured upon discharge, it is possible to immediately determine degradation in the capacitance value and the equivalent series resistance value, and to provide a notification thereof. Moreover, it is also possible to, for example, reduce a load of processing of the power supply controller by performing charge alone and no measurement during charge, and reduce a period for charge of the power supply device 1. Even when the vehicle was in the stopped state for a short time, the capacitance value and the equivalent series resistance value may be obtained every time or if necessary by measurement upon charge by the charge circuit or measurement upon discharge by the discharge circuit, or both thereof.

The capacitance value and the equivalent series resistance value measured in step S80 are examples of the first capacitance value and the first equivalent series resistance value. The capacitance value and the equivalent series resistance value measured in step S20 are examples of a second capacitance value and a second equivalent series resistance value.

[Charge Process]

Figure 17:
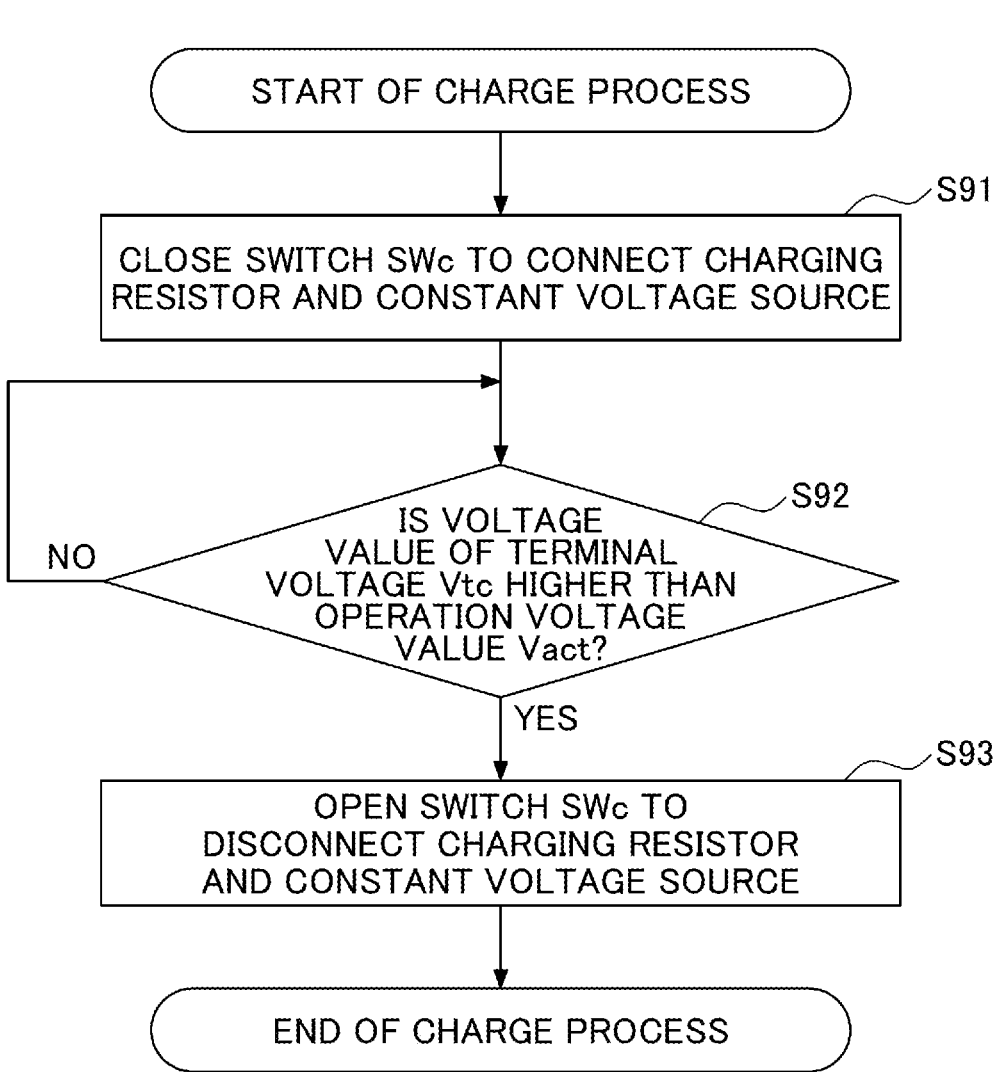
FIG. 17 is a flowchart of a charge process of the storage circuit in the power supply device according to the first embodiment.

Next, a charge process of step S90 will be described. FIG. 17 is a flowchart of a charge process of the storage circuit 10 in the power supply device 1 according to the first embodiment. The charge process will be described using the equivalent circuit diagram of FIG. 14.

(Step S91)

First, the power supply controller 50 turns on (closes) the switch SWc, and connects the power supply 100 and the charging resistor Rc to the storage circuit 10. When the power supply 100 and the charging resistor Rc are connected to the storage circuit 10, the electrical double layer capacitor 11 and the electrical double layer capacitor 12 of the storage circuit 10 are charged. Therefore, the terminal voltage Vtc gradually increases. At this time, the switch SWc may be intermittently turned on (closed) for PWM operation, or Duty of PWM may be changed for pseudo-constant current charge.

(Step S92)

Next, the power supply controller 50 measures the terminal voltage Vtc. Further, the power supply controller 50 determines whether or not the voltage value of the terminal voltage Vtc is higher than the operation voltage value Vact. When the voltage value of the terminal voltage Vtc is lower than or equal to the operation voltage value Vact (NO in step S93), the power supply controller 50 repeats step S92. When the voltage value of the terminal voltage Vtc is higher than the operation voltage value Vact (YES in step S92), the power supply controller 50 causes the process to proceed to step S93.

(Step S93)

Next, the power supply controller 50 turns off (opens) the switch SWc to disconnect the power supply 100 and the charging resistor Rc from the storage circuit 10. Then, the power supply controller 50 ends the charge process.

Second Embodiment

<Power Supply Device 1a>

Figure 18:
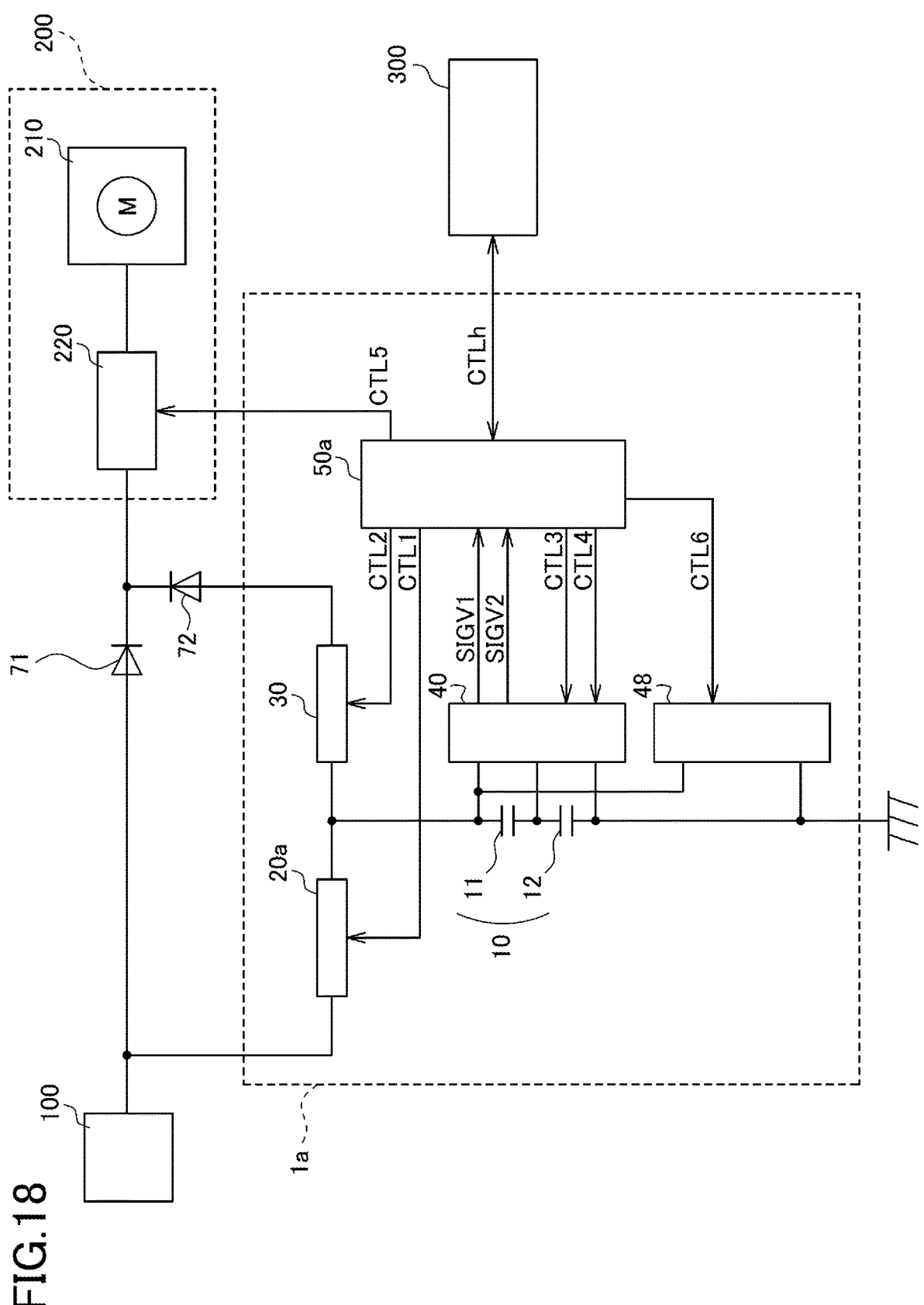
FIG. 18 is a diagram illustrating a configuration example of a power supply device according to a second embodiment.

FIG. 18 is a diagram illustrating a configuration example of a power supply device 1a according to the present embodiment. The power supply device 1a further includes a constant current discharge circuit 48 in the power supply device 1. Moreover, the power supply device 1a includes a charge circuit 20a and a power supply controller 50a instead of the charge circuit 20 and the power supply controller 50 of the power supply device 1.

[Constant Current Discharge Circuit 48]

The constant current discharge circuit 48 is a circuit configured to perform discharge from the storage circuit 10 at a predetermined constant current. The constant current discharge circuit 48 is controlled by the power supply controller 50a. The power supply controller 50a controls the constant current discharge circuit 48 by a discharge control signal CTL6.

The power supply device 1a according to the second embodiment is different from the power supply device 1 according to the first embodiment in terms of the manner of the discharge-based characteristics measurement process in step S20 and in terms of the manner of the charge-based characteristics measurement process in step S80.

[Discharge-based Characteristics Measurement Process]

Figure 19:
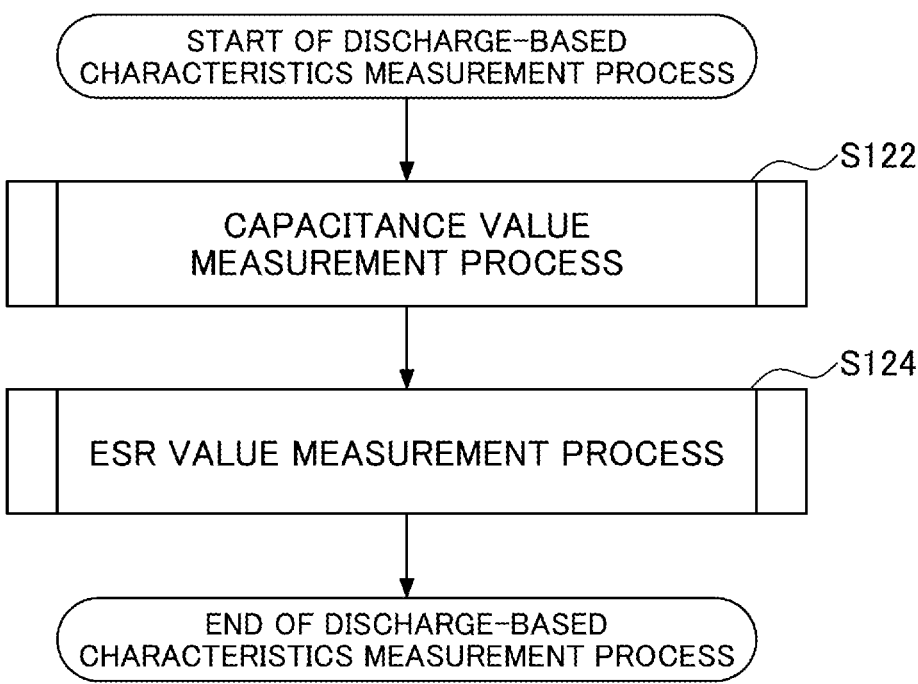
FIG. 19 is a flowchart illustrating a discharge-based characteristics measurement process of the power supply device according to the second embodiment.

First, the discharge-based characteristics measurement process of the storage circuit 10 in the power supply controller 50a of the power supply device 1a according to the second embodiment will be described. FIG. 19 is a flowchart illustrating a discharge-based characteristics measurement process of the power supply device 1a according to the second embodiment. The discharge-based characteristics measurement process includes a capacitance value measurement process (step S122) and an equivalent series resistance value measurement process (ESR value measurement process) (step S124). The power supply controller 50a determines the capacitance value and the equivalent series resistance value of the storage circuit 10, as the characteristics of the storage circuit 10.

[Capacitance Value and Equivalent Series Resistance Value of Storage Circuit 10]

Figure 20:
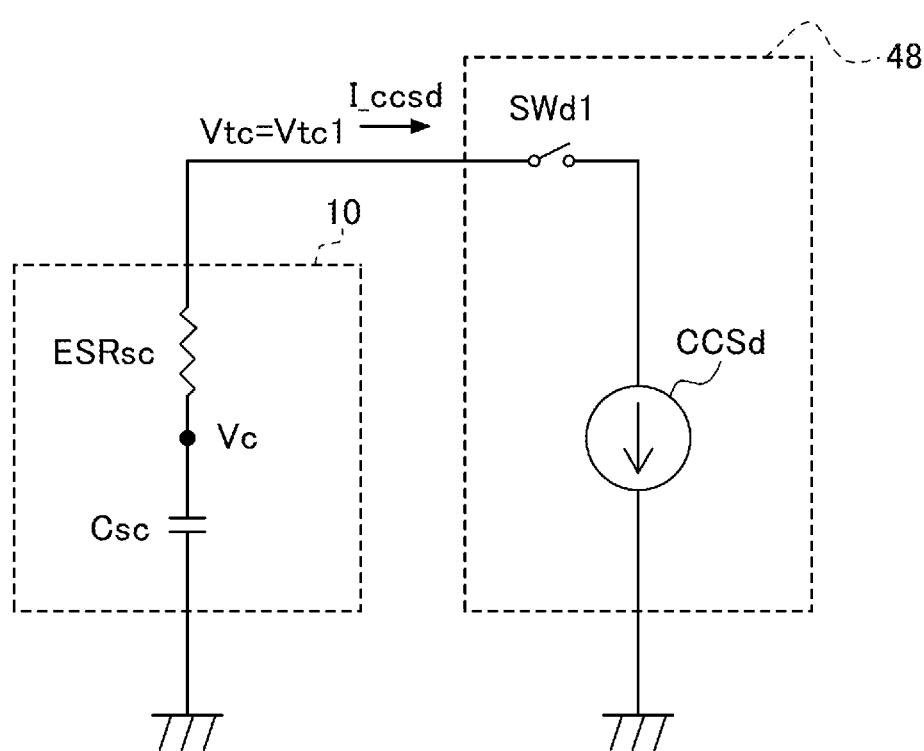
FIG. 20 is an equivalent circuit diagram of a circuit configured to perform the discharge-based characteristics measurement process of a storage circuit in the power supply device according to the second embodiment.

The characteristics of the storage circuit 10 in the power supply device 1a according to the second embodiment will be described. FIG. 20 is an equivalent circuit diagram of a circuit configured to perform the discharge-based characteristics measurement process of the storage circuit 10 in the power supply device 1a according to the second embodiment.

In the storage circuit 10 according to the present embodiment, the electrical double layer capacitor 11 and the electrical double layer capacitor 12 that are connected in series, are equivalently regarded as one capacitor having a capacitance value Csc and one resistor having a resistance value ESRsc and connected in series to the one capacitor. Further, the characteristics of the storage circuit 10 are determined using the capacitance value Csc and the resistance value ESRsc.

The constant current discharge circuit 48 includes a constant current source CCSd and a switch SWd1. The constant current source CCSd causes a constant current I_ccsd to flow when the switch SWd1 is turned on (closed).

[Measurement of Capacitance Value of Storage Circuit 10]

Figure 21:
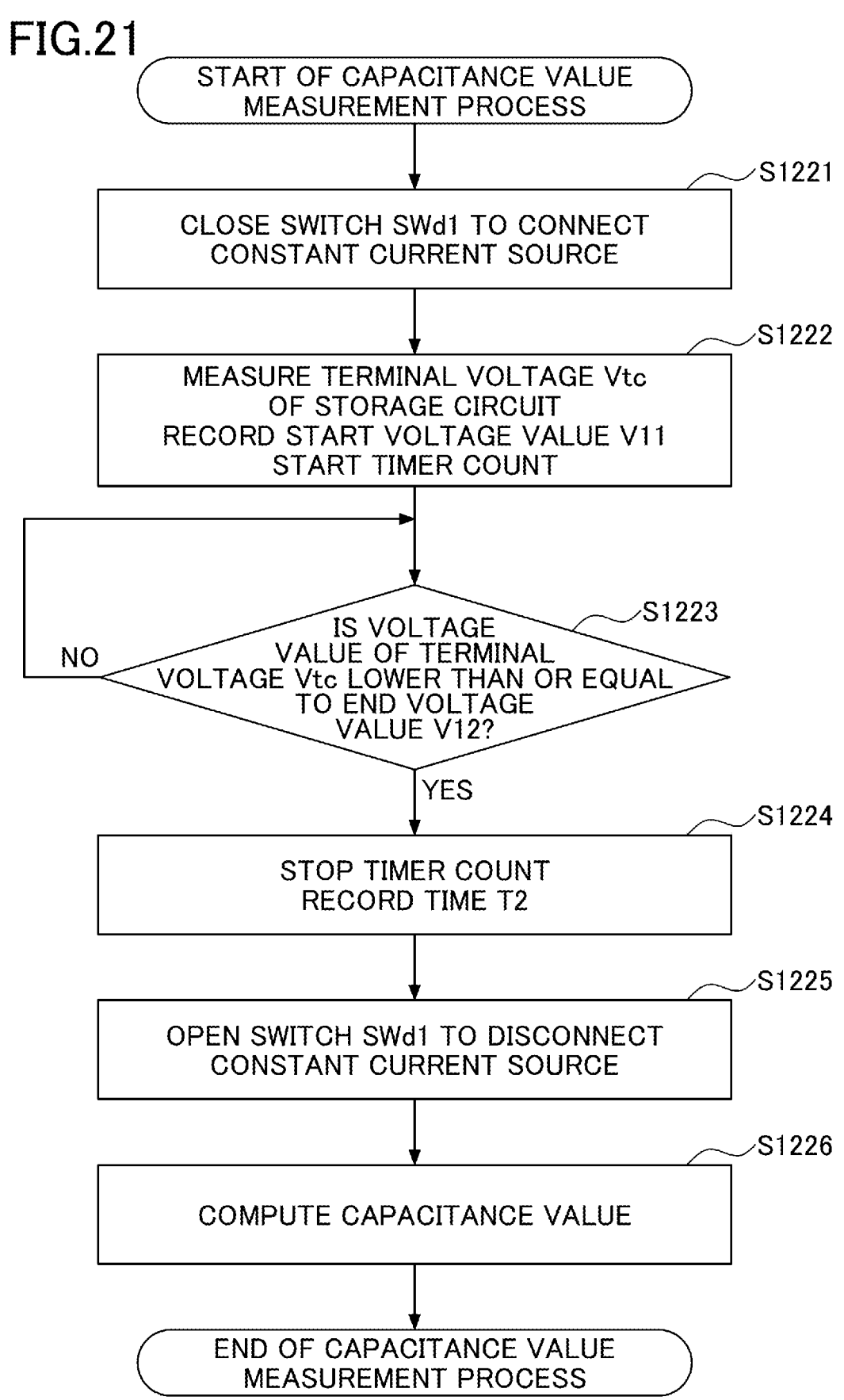
FIG. 21 is a flowchart of a capacitance value measurement process of the storage circuit in the power supply device according to the second embodiment.

FIG. 21 is a flowchart of a capacitance value measurement process of the storage circuit 10 in the power supply device 1a according to the second embodiment. When performing this process, the charge circuit 20a and the boosting circuit 30 stop operating. That is, in this state, the storage circuit 10 is not charged from the power supply 100. In addition, in this state, the storage circuit 10 does not perform power supply to the load device 200. Also, the switch SW1 and the switch SW2 of the equalization and discharge circuit 40 are turned off (opened).

The processing procedure of the power supply controller 50a of the power supply device 1a according to the second embodiment and the steps of the control method for the power supply device 1a, will be described in conjunction with the flowchart of FIG. 21.

(Step S1221)

First, the power supply controller 50a turns on (closes) the switch SWd1 of the constant current discharge circuit 48. When the switch SWd1 is turned on (closed), the constant current source CCSd is connected to the storage circuit 10. When the constant current source CCSd is connected to the storage circuit 10, the constant current I_ccsd flows to the ground from the storage circuit 10. When the constant current I_ccsd flows to the ground from the storage circuit 10, the terminal voltage Vtc of the storage circuit 10 starts decreasing.

(Step S1222)

Next, the power supply controller 50a measures the terminal voltage Vtc of the storage circuit 10. Further, the power supply controller 50a records (obtains) the measured voltage value of the terminal voltage Vtc, as a start voltage value V11. Also, the timer count is started.

(Step S1223)

Next, the power supply controller 50a determines whether or not the voltage value of the terminal voltage Vtc of the storage circuit 10 is lower than or equal to an end voltage value V12 that is set to a predetermined value. When the voltage value of the terminal voltage Vtc of the storage circuit 10 is higher than the predetermined end voltage value V12 (NO in step S1223), the power supply controller 50a performs step S1223 again. When the voltage value of the terminal voltage Vtc of the storage circuit 10 is lower than or equal to the predetermined end voltage value V12 (YES in step S1223), the power supply controller 50a causes the process to proceed to step S1224. The end voltage value V12 is set to a value lower than the start voltage value V11.

(Step S1224)

Next, the power supply controller 50a stops the timer count, and records the counted value. Further, the power supply controller 50a computes, and records, a time T2 from the start of the timer count from the counted value to the stop of the timer count. The process of step S1224 is desirably performed simultaneously as step S1223, or as quickly as possible within a range executable by the power supply controller 50a after performing step S1223.

(Step S1225)

Next, the power supply controller 50a turns off (opens) the switch SWd1. When the switch SWd1 is turned off (opened), the constant current source CCSd is disconnected from the storage circuit 10.

(Step S1226)

Next, the power supply controller 50a computes a capacitance value Csc according to Formula 6, using the measured start voltage value V11 and end voltage value V12, and the time T2. The current value Ic is a current value of a current I_ccsd that is a constant current flowing the constant current source CCSd.

[Formula 6]

$$Csc = T2 \times Ic/(V11 - V12) \qquad \text{Formula 6}$$

For example, in step S1223, when the voltage value of the terminal voltage Vtc of the storage circuit 10 becomes lower than or equal to the end voltage value V12, the terminal voltage Vtc of the storage circuit 10 may be measured again and set as the end voltage value V12. Alternatively, a set time Ts may be set first, and the voltage value of the terminal voltage Vtc of the storage circuit 10 after the time Ts passes after the switch SWd1 is turned on (closed) and the terminal voltage Vtc is measured in step S1222, may be measured as the end voltage value V12. When the time Ts is set, the time T2 in Formula 6 is the time Ts.

The power supply device 1a according to the present embodiment can measure the capacitance value of the storage circuit 10 during discharge in which a current is discharged from the storage circuit 10. In addition, the power supply device 1a according to the present embodiment can monitor the characteristic degradation of the electrical double layer capacitor included in the storage circuit 10, by measuring the capacitance value of the storage circuit 10.

[Measurement of Equivalent Series Resistance Value of Storage Circuit 10]

Figure 22:
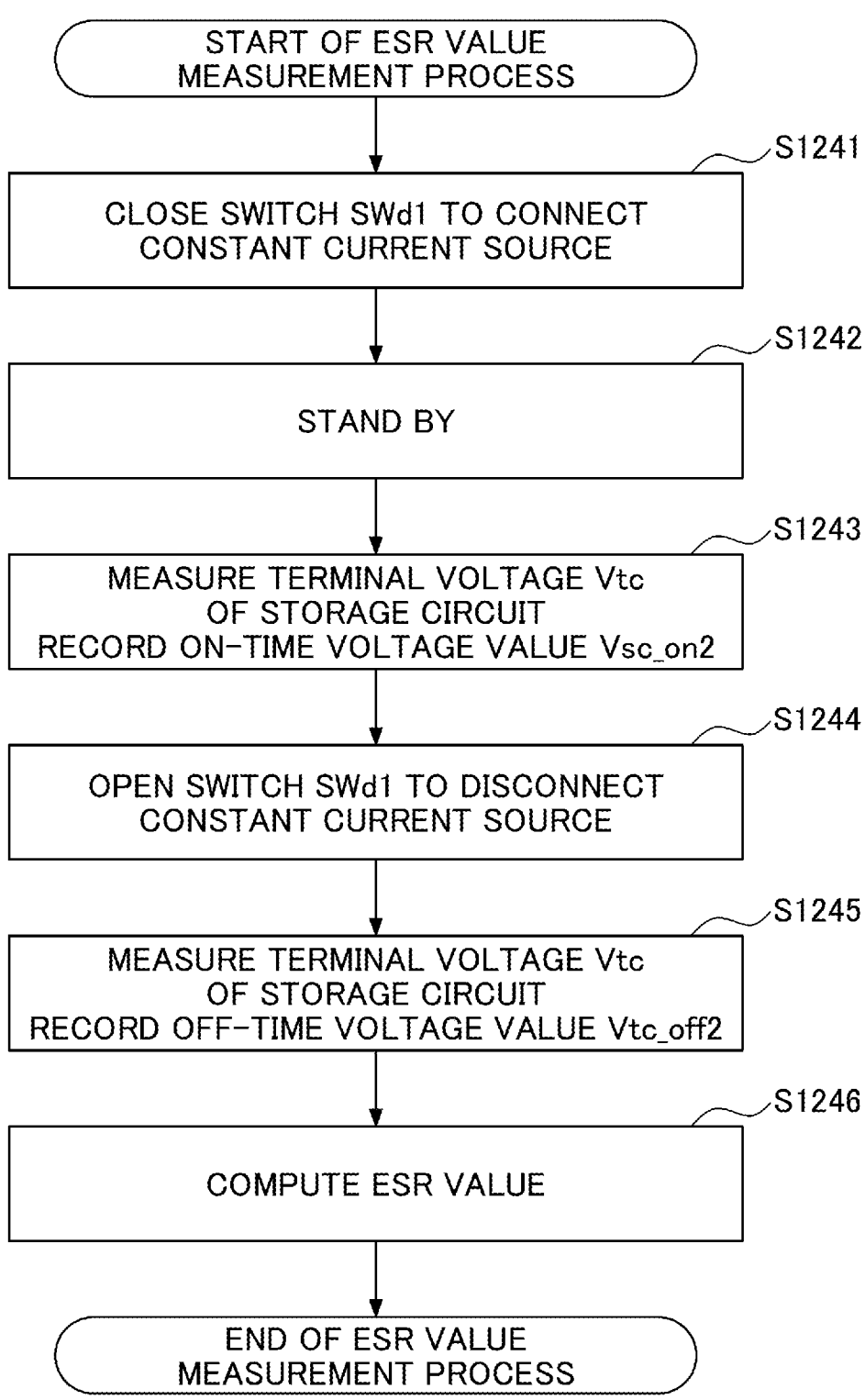
FIG. 22 is a flowchart of an equivalent series resistance value measurement process of the storage circuit in the power supply device according to the second embodiment.

FIG. 22 is a flowchart of an equivalent series resistance value measurement process of the storage circuit 10 in the power supply device 1a according to the second embodiment. When performing this process, the charge circuit 20a and the boosting circuit 30 stop operating. That is, in this state, the storage circuit 10 is not charged from the power supply 100. In addition, in this state, the storage circuit 10 does not perform power supply to the load device 200. Also, the switch SW1 and the switch SW2 of the equalization and discharge circuit 40 are turned off (opened).

The processing procedure of the power supply controller 50a of the power supply device 1a according to the present embodiment and the steps of the control method for the power supply device 1a, will be described in conjunction with the flowchart of FIG. 22.

(Step S1241)

First, the power supply controller 50a turns on (closes) the switch SWd1. When the switch SWd1 is turned on (closed), the constant current source CCSd is connected to the storage circuit 10. When the constant current source CCSd is connected to the storage circuit 10, the constant current I_ccsd flows to the ground from the storage circuit 10. When the constant current I_ccsd flows to the ground from the storage circuit 10, the terminal voltage Vtc of the storage circuit 10 starts decreasing.

(Step S1242)

Next, the power supply controller 50a is on standby for a certain period. For example, until the current I_ccsd becomes stable, the power supply controller 50a stands by for a certain period.

(Step S1243)

Next, the power supply controller 50a measures the terminal voltage Vtc of the storage circuit 10. Further, the power supply controller 50a stores (obtains) the measured voltage value of the terminal voltage Vtc, as an on-time voltage value Vsc_on2.

(Step S1244)

Next, the power supply controller 50a turns off (opens) the switch SWd1 immediately after measuring the terminal voltage Vtc of the storage circuit 10 in step S1243. When the switch SWd1 is turned off (opened), the constant current source CCSd is disconnected from the storage circuit 10. The process of step S1244 is desirably performed simultaneously as step S1243, or as quickly as possible within a range executable by the power supply controller 50a after performing step S1243.

(Step S1245)

Next, after the switch SW1 is turned off (opened), the power supply controller 50a measures the terminal voltage Vtc of the storage circuit 10. Further, the power supply controller 50a records (obtains) the measured voltage value of the terminal voltage Vtc, as an off-time voltage value Vsc_off2.

(Step S1246)

Next, the power supply controller 50a computes an equivalent series resistance value ESR according to Formula 7, using the measured on-time voltage value Vsc_on2 and off-time voltage value Vsc_off2. The current value Ic is a current value of a current I_ccsd that is a constant current flowing the constant current source CCSd.

[Formula 7]

$$ESR = (Vsc\_on2 - Vsc\_off2)/Ic \qquad \text{Formula 7}$$

The power supply device 1a according to the present embodiment can measure the equivalent series resistance value of the storage circuit 10 during discharge in which a current is discharged from the storage circuit 10. In addition, the power supply device 1a according to the present embodiment can monitor the characteristic degradation of the electrical double layer capacitor included in the storage circuit 10, by measuring the equivalent series resistance value of the storage circuit 10.

[Charge-based Characteristics Measurement Process]

Figure 23:
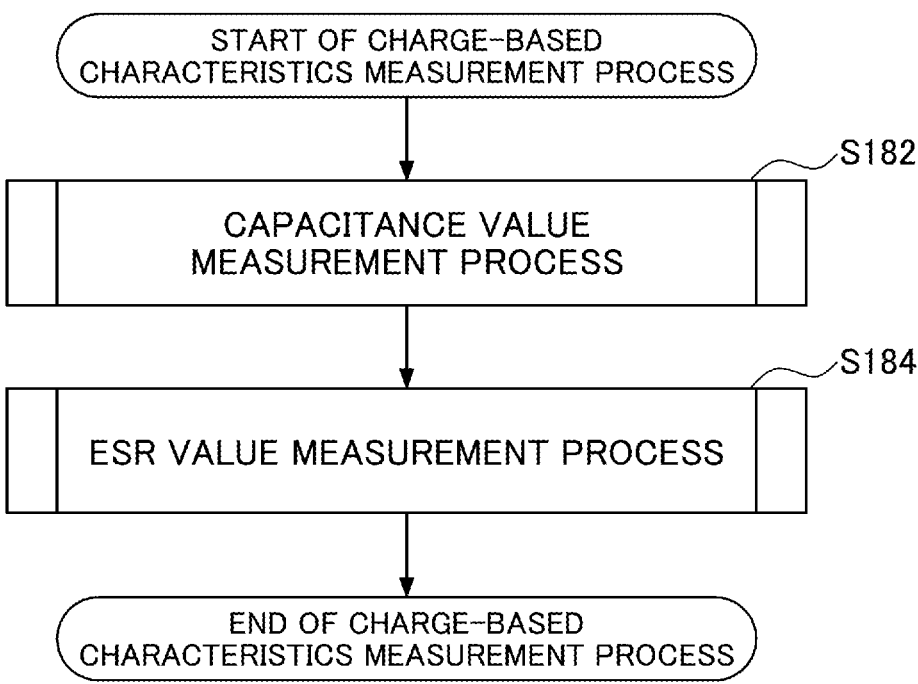
FIG. 23 is a flowchart of a charge-based characteristics measurement process of the power supply device according to the second embodiment.

The charge-based characteristics measurement process of the storage circuit 10 in the power supply controller 50a of the power supply device 1a according to the second embodiment will be described. FIG. 23 is a flowchart of the charge-based characteristics measurement process of the power supply device 1a according to the second embodiment. The charge-based characteristics measurement process includes a capacitance value measurement process (step S182) and an equivalent series resistance value measurement process (ESR value measurement process) (step S184). The power supply controller 50a determines the capacitance value and the equivalent series resistance value of the storage circuit 10, as the characteristics of the storage circuit 10.

[Capacitance Value and Equivalent Series Resistance Value of Storage Circuit 10]

Figure 24:
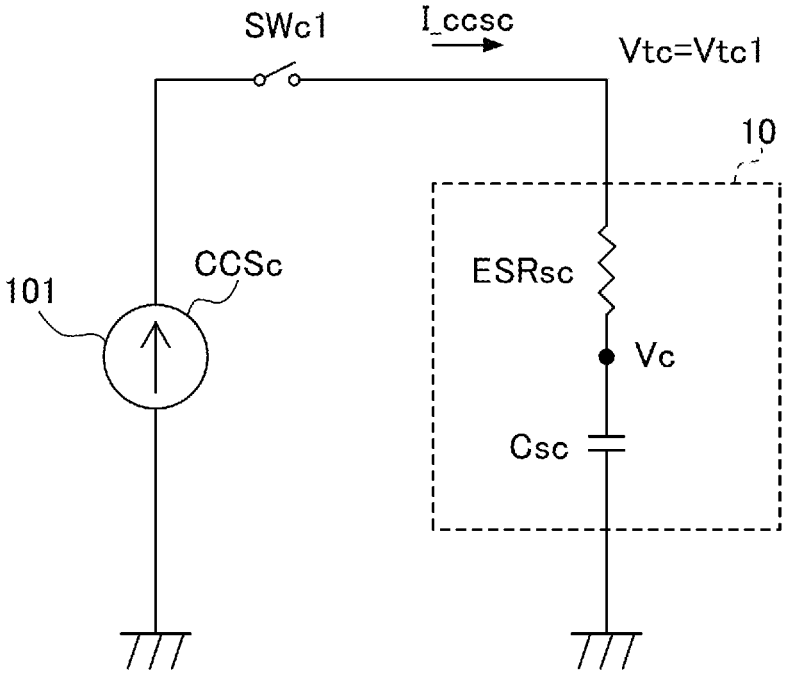
FIG. 24 is an equivalent circuit diagram of a circuit configured to perform the charge-based characteristics measurement process of the storage circuit in the power supply device according to the second embodiment.

The characteristics of the storage circuit 10 in the power supply device 1a according to the second embodiment will be described. FIG. 24 is an equivalent circuit diagram of a circuit configured to perform the charge-based characteristics measurement process of the storage circuit 10 in the power supply device 1a according to the second embodiment.

In the storage circuit 10 according to the present embodiment, the electrical double layer capacitor 11 and the electrical double layer capacitor 12 that are connected in series, are equivalently regarded as one capacitor having a capacitance value Csc and one resistor having a resistance value ESRsc and connected in series to the one capacitor. Further, the characteristics of the storage circuit 10 are determined using the capacitance value Csc and the resistance value ESRsc.

In the storage circuit 10 according to the second embodiment, the storage circuit 10 is charged by the constant current source CCSc. The power supply 101 is the constant current source CCSc. The power supply 101 is formed, for example, by combining the power supply 100 and the charge circuit 20a. The power supply 101 charges the storage circuit 10 with the constant current I_ccsc. The power supply device 1a includes a switch SWc1 between the power supply 101 and the storage circuit 10. For example, the charge circuit 20a includes the switch SWc1.

[Measurement of Capacitance Value of Storage Circuit 10]

Figure 25:
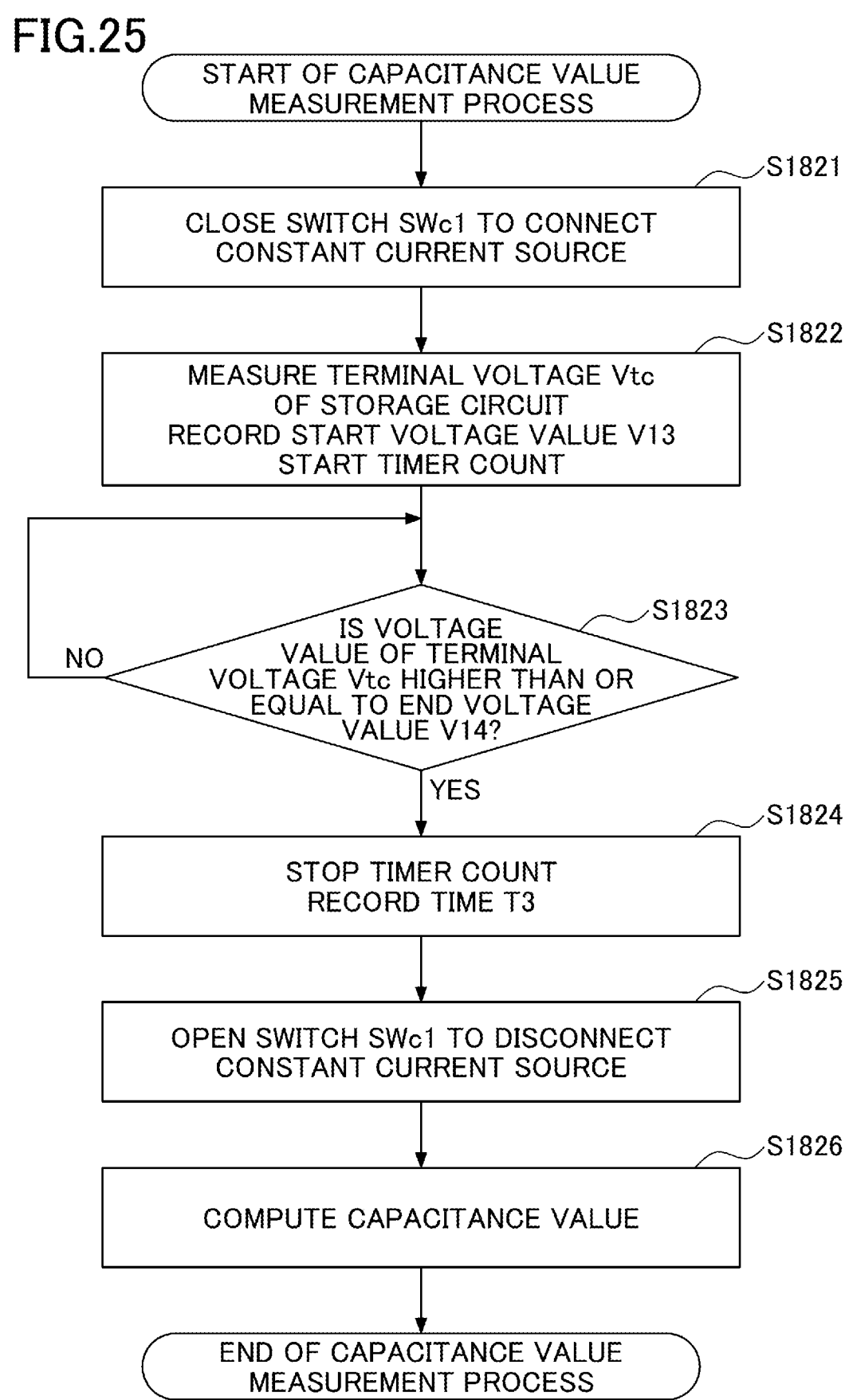
FIG. 25 is a flowchart of the capacitance value measurement process of the storage circuit in the power supply device according to the second embodiment.

FIG. 25 is a flowchart of the capacitance value measurement process of the storage circuit 10 in the power supply device 1a according to the second embodiment. When performing this process, the boosting circuit 30, the equalization and discharge circuit 40, and the constant current discharge circuit 48 stop operating. That is, in this state, the storage circuit 10 does not perform power supply to the load device 200, nor equalization discharge and constant current discharge.

The processing procedure of the power supply controller 50a of the power supply device 1a according to the second embodiment and the steps of the control method for the power supply device 1a, will be described in conjunction with the flowchart of FIG. 25.

(Step S1821)

First, the power supply controller 50a turns on (closes) the switch SWc1. When the switch SWc1 is turned on (closed), the power supply 101 is connected to the storage circuit 10. When the power supply 101 is connected to the storage circuit 10, the storage circuit 10 is charged by the power supply 101. When the storage circuit 10 is charged, the terminal voltage Vtc of the storage circuit 10 starts increasing.

(Step S1822)

Next, the power supply controller 50a measures the terminal voltage Vtc of the storage circuit 10. Further, the power supply controller 50a records (obtains) the measured voltage value of the terminal voltage Vtc, as a start voltage value V13. Also, the timer count is started.

(Step S1823)

Next, the power supply controller 50a determines whether or not the voltage value of the terminal voltage Vtc of the storage circuit 10 is higher than or equal to an end voltage value V14 that is set to a predetermined value. When the voltage value of the terminal voltage Vtc of the storage circuit 10 is lower than the predetermined end voltage value V14 (NO in step S1823), the power supply controller 50a performs step S1823 again. When the voltage value of the terminal voltage Vtc of the storage circuit 10 is higher than or equal to the predetermined end voltage value V14 (YES in step S1823), the power supply controller 50a causes the process to proceed to step S1824. The end voltage value V14 is set to a value higher than the start voltage value V13.

(Step S1824)

Next, the power supply controller 50a stops the timer count, and records the counted value. Further, the power supply controller 50a computes, and records, a time T3 from the start of the timer count from the counted value to the stop of the timer count. The process of step S1824 is desirably performed simultaneously as step S1823, or as quickly as possible within a range executable by the power supply controller 50a after performing step S1823.

(Step S1825)

Next, the power supply controller 50a turns off (opens) the switch SWc1. When the switch SWc1 is turned off (opened), the power supply 101 is disconnected from the storage circuit 10.

(Step S1826)

Next, the power supply controller 50a computes a capacitance value Csc according to Formula 8, using the measured start voltage value V13 and end voltage value V14, and the time T3. The current value Ic is a current value of a current I_ccsc that is a constant current flowing the constant current source CCSc.

[Formula 8]

$$Csc = T3 \times Ic/(V14 - V13) \qquad \text{Formula 8}$$

For example, in step S1823, when the voltage value of the terminal voltage Vtc of the storage circuit 10 becomes higher than or equal to the end voltage value V14, the terminal voltage Vtc of the storage circuit 10 may be measured again and set as the end voltage value V14. Alternatively, a set time Ts may be set first, and the voltage value of the terminal voltage Vtc of the storage circuit 10 after the time Ts passes after the switch SWc1 is turned on (closed) and the terminal voltage Vtc is measured in step S1822, may be measured as the end voltage value V14. When the time Ts is set, the time T3 in Formula 8 is the time Ts.

The power supply device 1a according to the present embodiment can measure the capacitance value of the storage circuit 10 during charge in which a current flows to the storage circuit 10. In addition, the power supply device 1a according to the present embodiment can monitor the characteristic degradation of the electrical double layer capacitor included in the storage circuit 10, by measuring the capacitance value of the storage circuit 10.

[Measurement of Equivalent Series Resistance Value of Storage Circuit 10]

FIG. 26 is a flowchart of the equivalent series resistance value measurement process of the storage circuit 10 in the power supply device 1a according to the second embodiment. When performing this process, the boosting circuit 30 stops operating. That is, in this state, the storage circuit 10 does not perform power supply to the load device 200.

The processing procedure of the power supply controller 50a of the power supply device 1a according to the present embodiment and the steps of the control method for the power supply device 1a, will be described in conjunction with the flowchart of FIG. 26.

(Step S1841)

First, the power supply controller 50a turns on (closes) the switch SWc1. When the switch SWc1 is turned on (closed), the power supply 101 is connected to the storage circuit 10. When the power supply 101 is connected to the storage circuit 10, the storage circuit 10 is charged by the power supply 101. When the storage circuit 10 is charged, the terminal voltage Vtc of the storage circuit 10 gradually increases.

(Step S1842)

Next, the power supply controller 50a stands by for a certain period. For example, until the charge current becomes stable, the power supply controller 50a stands by for a certain period.

(Step S1843)

Next, the power supply controller 50a measures the terminal voltage Vtc of the storage circuit 10. Further, the power supply controller 50a stores (obtains) the measured voltage value of the terminal voltage Vtc, as an on-time voltage value Vsc_on3.

(Step S1844)

Next, the power supply controller 50a turns off (opens) the switch SWc1 immediately after measuring the terminal voltage Vtc of the storage circuit 10 in step S1843. When the switch SWc1 is turned off (opened), the power supply 101 is disconnected from the storage circuit 10. The process of step S1844 is desirably performed simultaneously as step S1843, or as quickly as possible within a range executable by the power supply controller 50a after performing step S1843.

(Step S1845)

Next, after the switch SWc1 is turned off (opened), the power supply controller 50a measures the terminal voltage Vtc of the storage circuit 10. Further, the power supply controller 50a records (obtains) the measured voltage value of the terminal voltage Vtc, as an off-time voltage value Vsc_off3.

(Step S1846)

Next, the power supply controller 50a computes an equivalent series resistance value ESR according to Formula 9, using the measured on-time voltage value Vsc_on3 and off-time voltage value Vsc_off3. The current value Ic is a current value of a current I_ccsc that is a constant current flowing the constant current source CCSc.

[Formula 9]

$$ESR = (Vsc\_on3 - Vsc\_off3)/Ic \qquad \text{Formula 9}$$

The power supply device 1a according to the present embodiment can measure the capacitance value of the storage circuit 10 during charge in which a current flows to the storage circuit 10. In addition, the power supply device 1a according to the present embodiment can monitor the characteristic degradation of the electrical double layer capacitor included in the storage circuit 10, by measuring the capacitance value of the storage circuit 10.

Third Embodiment

The power supply device 1 according to the first embodiment and the power supply device 1a according to the second embodiment perform the discharge-based characteristics measurement process in step S20 and the charge-based characteristics measurement process in step S80. However, the characteristics measurement process that is a combination of the discharge-based characteristics measurement process and the charge-based characteristics measurement process may be performed in each of step S20 and step S80.

[Characteristics Measurement Process]

Figure 27:
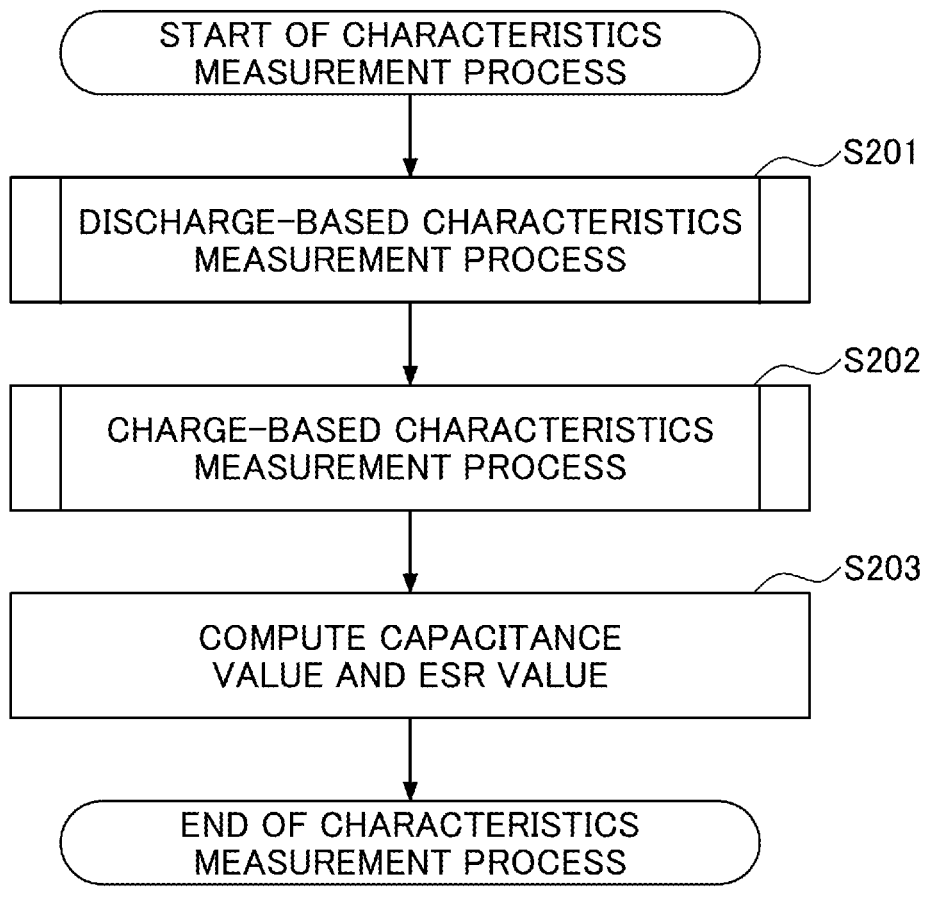
FIG. 27 is a flowchart of a characteristics measurement process of a power supply device according to a third embodiment.

FIG. 27 is a flowchart illustrating the characteristics measurement process as the combination of the discharge-based characteristics measurement process and the charge-based characteristics measurement process. The characteristics measurement process as the combination of the discharge-based characteristics measurement process and the charge-based characteristics measurement process includes a discharge-based characteristics measurement process (step S201) and a charge-based characteristics measurement process (step S202).

The discharge-based characteristics measurement process of step S201 is, for example, the discharge-based characteristics measurement process of the power supply device 1 according to the first embodiment (see FIG. 5 and FIG. 9) or the discharge-based characteristics measurement process of the power supply device 1a according to the second embodiment (see FIG. 19). Also, the charge-based characteristics measurement process of step S202 is, for example, the charge-based characteristics measurement process of the power supply device 1 according to the first embodiment (see FIG. 13) or the charge-based characteristics measurement process of the power supply device 1a according to the second embodiment (see FIG. 23).

In step S203, by combining the measurement result of the discharge-based characteristics measurement process of step S201 and the measurement result of the charge-based characteristics measurement process of step S202, the power supply controller 50a determines the capacitance value and the equivalent series resistance value of the storage circuit 10, as the characteristics of the storage circuit 10.

For example, the power supply controller 50a may determine an average or weighted average of the capacitance value obtained in the discharge-based characteristics measurement process of step S201 and the capacitance value obtained in the charge-based characteristics measurement process of step S202, as the capacitance value of the storage circuit 10. Also, the power supply controller 50a may determine an average or weighted average of the equivalent series resistance value obtained in the discharge-based characteristics measurement process of step S201 and the equivalent series resistance value obtained in the charge-based characteristics measurement process of step S202, as the equivalent series resistance value of the storage circuit 10.

Also, for example, the power supply controller 50a may select one capacitance value estimated to have high reliability from the capacitance value obtained in the discharge-based characteristics measurement process of step S201 and the capacitance value obtained in the charge-based characteristics measurement process of step S202, and determine the selected capacitance value as the capacitance value of the storage circuit 10. The power supply controller 50a may select one equivalent series resistance value estimated to have high reliability from the equivalent series resistance value obtained in the discharge-based characteristics measurement process of step S201 and the equivalent series resistance value obtained in the charge-based characteristics measurement process of step S202, and determine the selected equivalent series resistance value as the equivalent series resistance value of the storage circuit 10.

Operations and Effects

The power supply device according to the present embodiment can obtain characteristics of the electrical double layer capacitor that are effective upon start of use, by obtaining the characteristics of the electrical double layer capacitor when it is determined that the period for which the vehicle was in the stopped state is longer than the threshold period.

The embodiments of the power supply device have been described above. However, the present invention should not be construed as being limited to the above embodiments. Various modifications and improvements, such as combinations and substitutions with a part or the entirety of the other embodiments, are possible within the scope of the present invention.

Use of the power supply device according to the present embodiment is not limited to the backup power supply of the electric latch system, and may be used as a backup power supply for backup of a brake system (electric brakes including an electric parking brake), backup of an airbag system, and the like. Also, the power supply device according to the present embodiment is not limited to the backup power supply, and may be used as a main power supply (power supply used in a normal state).

The present application is based on and claims priority to Japanese Patent Application No. 2021-162343, filed on Sep. 30, 2021, the entire contents of which are incorporated herein by reference.

DESCRIPTION OF REFERENCE NUMERALS 1, 1a Power supply device
10 Storage circuit
11, 12 Electrical double layer capacitor
20, 20a Charge circuit
30 Boosting circuit
40 Equalization and discharge circuit
41 Switch
41a First terminal
41b Second terminal
42 Switch
42a First terminal
42b Second terminal
45 Resistor
46 Resistor
48 Constant current discharge circuit
50, 50a Power supply controller
300 Vehicle controller

The invention claimed is:

1. A power supply device, comprising:
a storage circuit including a first node connected to a power supply, a second node that is grounded, and an electrical double layer capacitor between the first node and the second node;
a charge circuit connected to the first node and configured to charge the storage circuit;
a power supply controller configured to measure a voltage at the first node and control the charge circuit, wherein
the power supply controller is configured to perform, when a stop period of an engine is longer than a threshold period, a procedure of causing the charge circuit to charge the storage circuit and computing a first capacitance value and a first equivalent series resistance value based on the voltage measured at the first node; and a discharge circuit connected to the first node and configured to discharge the storage circuit, wherein
the power supply controller is configured to perform, when the stop period of the engine is shorter than or equal to the threshold period, a procedure of computing a second capacitance value and a second equivalent series resistance value of the electrical double layer capacitor based on the voltage at the first node while discharging the storage circuit by the discharge circuit.

2. The power supply device according to claim 1, wherein the power supply controller is configured to estimate the stop period based on the voltage at the first node.

3. The power supply device according to claim 1, wherein the power supply controller determines degradation of the electrical double layer capacitor based on the second capacitance value and the second equivalent series resistance value, in response to determining that the stop period is shorter than the threshold period.

4. A power supply device, comprising:
a storage circuit including a first node connected to a power supply, a second node that is grounded, a third node between the first node and the second node, and an electrical double layer capacitor between the first node and the second node;
a charge circuit connected to the first node and configured to charge the storage circuit; and
a power supply controller configured to measure a voltage at the first node and a voltage at the third node, and control the charge circuit, wherein
the power supply controller performs a procedure of causing the charge circuit to charge the storage circuit and computing a first capacitance value and a first equivalent series resistance value based on the voltage measured at the first node and the voltage measured at the third node, in response to determining that a stop period is longer than a threshold period.

5. A control method for a power supply device including a storage circuit including a first node connected to a power supply, a second node that is grounded, and an electrical double layer capacitor between the first node and the second node; a charge circuit connected to the first node and configured to charge the storage circuit; and a discharge circuit connected to the first node and configured to discharge the storage circuit, the control method comprising:
performing, when a stop period of an engine is longer than a threshold period, a procedure of causing the charge circuit to charge the storage circuit and computing a first capacitance value and a first equivalent series resistance value based on a voltage measured at the first node; and
performing, when the stop period of the engine is shorter than or equal to the threshold period, a procedure of computing a second capacitance value and a second equivalent series resistance value of the electrical double layer capacitor based on the voltage at the first node while discharging the storage circuit by the discharge circuit.

* * * * *